United States Patent
Muraoka

(10) Patent No.: US 11,252,348 B2
(45) Date of Patent: Feb. 15, 2022

(54) IMAGING DEVICE AND DRIVING METHOD OF IMAGING DEVICE

(71) Applicant: SONY SEMICONDUCTOR SOLUTIONS CORPORATION, Kanagawa (JP)

(72) Inventor: Kazuhiko Muraoka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/048,831

(22) PCT Filed: Apr. 19, 2019

(86) PCT No.: PCT/JP2019/016752
§ 371 (c)(1),
(2) Date: Oct. 19, 2020

(87) PCT Pub. No.: WO2019/208412
PCT Pub. Date: Oct. 31, 2019

(65) Prior Publication Data
US 2021/0152758 A1 May 20, 2021

(30) Foreign Application Priority Data

Apr. 27, 2018 (JP) .............................. JP2018-086284

(51) Int. Cl.
*H04N 5/345* (2011.01)
*H04N 9/04* (2006.01)
(Continued)

(52) U.S. Cl.
CPC ............ *H04N 5/343* (2013.01); *H04N 5/345* (2013.01); *H04N 5/378* (2013.01); *H04N 9/04511* (2018.08)

(58) Field of Classification Search
None
See application file for complete search history.

(56) References Cited

U.S. PATENT DOCUMENTS 6,839,452 B1    1/2005   Yang et al.
2004/0202281 A1 10/2004  Colbeth et al.
(Continued)

FOREIGN PATENT DOCUMENTS

CN    109328457 A    2/2019
CN    109997353 A    7/2019
(Continued)

OTHER PUBLICATIONS

International Search Report and Written Opinion of PCT Application No. PCT/JP2019/016752, dated Jul. 23, 2019, 08 pages of ISRWO.

(Continued)

*Primary Examiner* — Mark T Monk
(74) *Attorney, Agent, or Firm* — Chip Law Group

(57) ABSTRACT

An imaging device of the present disclosure includes a detection unit that detects a specific region in a taken image as a region of interest, a control unit that performs control to read out a pixel signal at first pixel resolution in a region including the region of interest and read out a pixel signal at second pixel resolution lower than the first pixel resolution in a region not including the region of interest, and an analog-digital conversion unit that converts the pixel signal read out by the control by the control unit into a digital signal.

8 Claims, 21 Drawing Sheets

(51) Int. Cl.
    *H01L 27/146*     (2006.01)
    *H04N 5/343*     (2011.01)
    *H04N 5/378*     (2011.01)

(56) References Cited

U.S. PATENT DOCUMENTS

| | | |
|---|---|---|
| 2006/0119903 A1 | 6/2006 | Chiba et al. |
| 2009/0021621 A1 | 1/2009 | Hashimoto et al. |
| 2009/0066782 A1 | 3/2009 | Choi et al. |
| 2012/0113119 A1 | 5/2012 | Massie |
| 2019/0346599 A1 | 11/2019 | Komai |

FOREIGN PATENT DOCUMENTS

| | | |
|---|---|---|
| EP | 1611776 A2 | 1/2006 |
| JP | 2006-166400 A | 6/2006 |
| JP | 4607099 B2 | 1/2011 |
| JP | 5063234 B2 | 10/2012 |
| JP | 2017-108281 A | 6/2017 |
| JP | 2018-022935 A | 2/2018 |
| KR | 10-2019-0029615 A | 3/2019 |
| WO | 2004/095064 A2 | 11/2004 |
| WO | 2018/025465 A1 | 2/2018 |
| WO | 2018/062303 A1 | 4/2018 |

OTHER PUBLICATIONS

Extended European Search Report of EP Application No. 19793713.9, dated Feb. 2, 2021, 08 pages.

HIGH-RESOLUTION READOUT

LOW-RESOLUTION READOUT

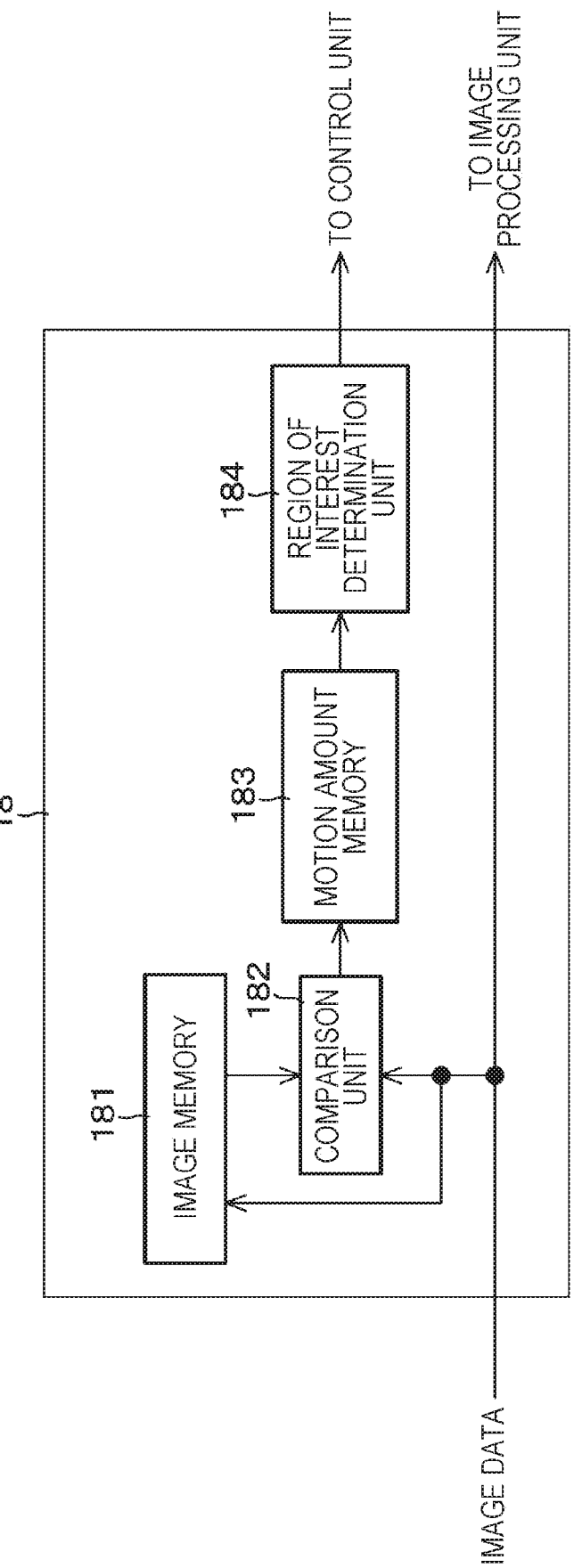

PAST IMAGE

CURRENT IMAGE

DIFFERENCE ABSOLUTE VALUE

LOW RESOLUTION
HIGH RESOLUTION
LOW RESOLUTION

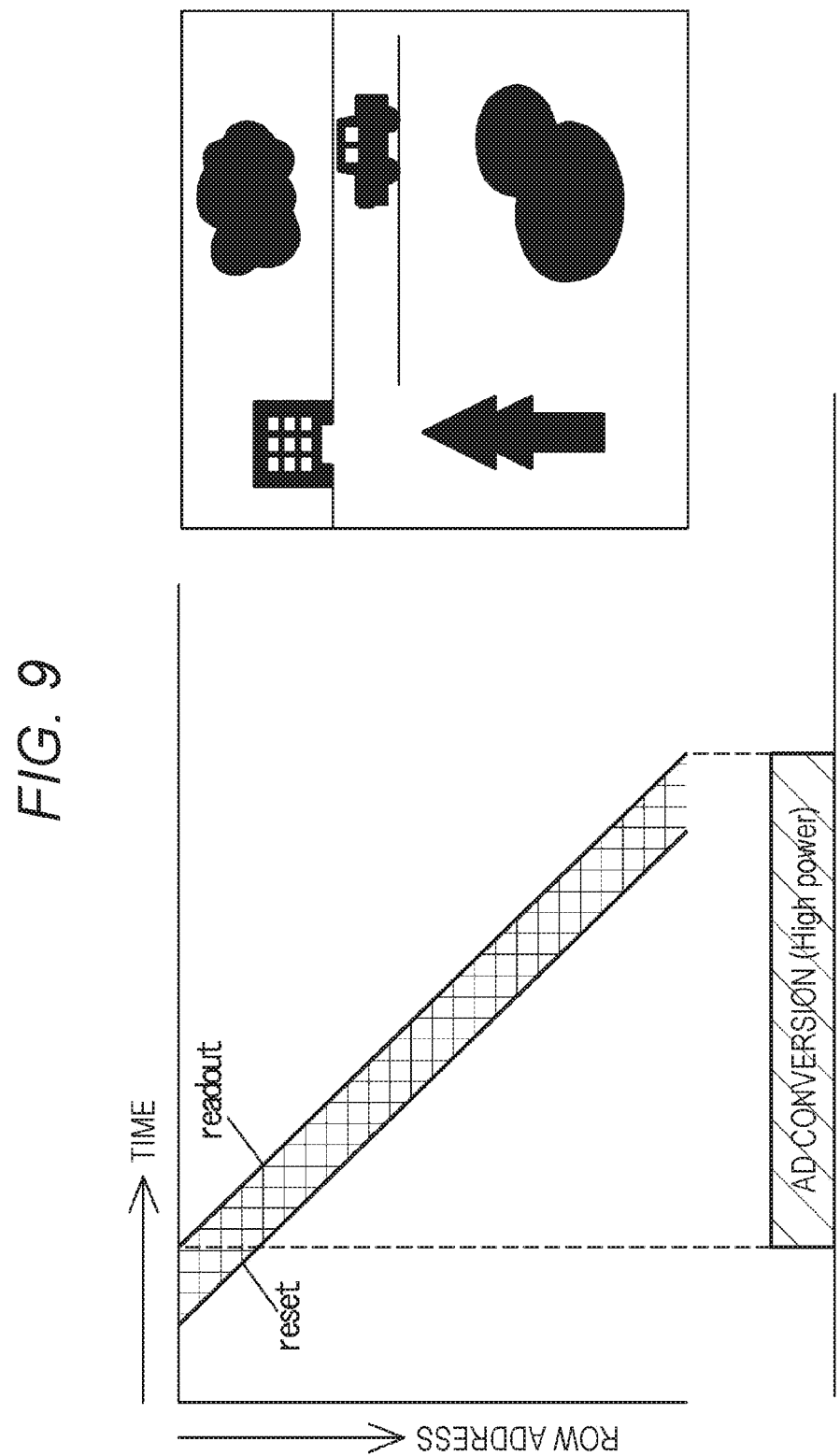

TO ANALOG-DIGITAL CONVERTER

TO ANALOG-DIGITAL CONVERTER

TO ANALOG-DIGITAL CONVERTER

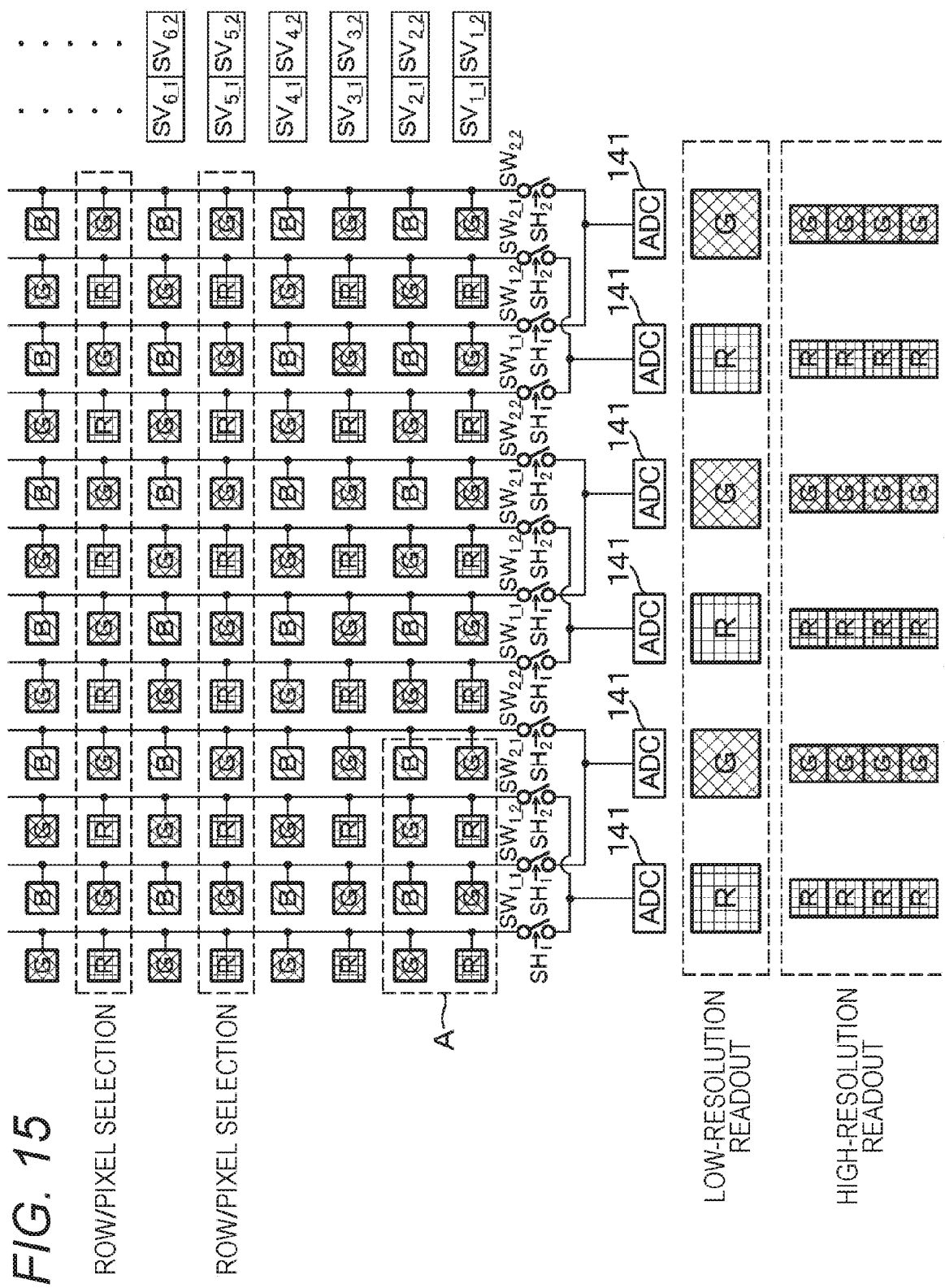

IMAGING DEVICE AND DRIVING METHOD OF IMAGING DEVICE

CROSS REFERENCE TO RELATED APPLICATIONS

This application is a U.S. National Phase of International Patent Application No. PCT/JP2019/016752 filed on Apr. 19, 2019, which claims priority benefit of Japanese Patent Application No. JP 2018-086284 filed in the Japan Patent Office on Apr. 27, 2018. Each of the above-referenced applications is hereby incorporated herein by reference in its entirety.

TECHNICAL FIELD

The present disclosure relates to an imaging device and a driving method of the imaging device.

BACKGROUND ART

In a conventional imaging device, a readout operation of signals of pixels of one imaging frame is performed at the same pixel resolution, so that when extracting a specific region (hereinafter, sometimes referred to as a "region of interest"), extraction of the region of interest is realized by detecting the region of interest and performing data calculation after reading out at high resolution.

Japanese Patent Application Laid-Open No. 2017-108281 (Patent Document 1) discloses a technology of using pixel signals of a unit group included in the region of interest (ROI) for detecting a focal point. In this conventional technology, after performing analog-digital conversion on signals of all the pixels, they are stored in an externally prepared memory, and thereafter, pixel data is added while leaving the region of interest designated by an external controller to create low resolution data.

CITATION LIST

Patent Document

Patent Document 1: Japanese Patent Application Laid-Open No. 2017-108281

SUMMARY OF THE INVENTION

Problems to be Solved by the Invention

By the way, in an imaging device equipped with an analog-digital conversion unit, it is the analog-digital conversion unit that consumes the power most. From this point of view, in the conventional technology disclosed in Patent Document 1, since the signals of all the pixels are subjected to the analog-digital conversion, power consumption increases. Furthermore, the pixel data is added to create the low-resolution data, and large power is consumed at the time of this adding process, too.

Therefore, an object of the present disclosure is to provide an imaging device and a driving method of the imaging device capable of reducing power consumption.

Solutions to Problems

An imaging device of the present disclosure for achieving the above-described object includes:

a detection unit that detects a specific region in a taken image as a region of interest;

a control unit that performs control to read out a pixel signal at first pixel resolution in a region including the region of interest and read out a pixel signal at second pixel resolution lower than the first pixel resolution in a region not including the region of interest; and an analog-digital conversion unit that converts the pixel signal read out by the control by the control unit into a digital signal.

A driving method of an imaging device of the present disclosure for achieving the above-described object includes:

when driving an imaging device including an analog-digital conversion unit that converts a pixel signal into a digital signal, detecting a specific region in a taken image as a region of interest; and reading out a pixel signal at first pixel resolution in a region including the region of interest and reading out a pixel signal at second pixel resolution lower than the first pixel resolution in a region not including the region of interest.

BRIEF DESCRIPTION OF DRAWINGS

FIG. 7 is a block diagram illustrating an example of a circuit configuration of a region of interest detection unit according to an example 2.

FIG. 9 is a view illustrating row address motion in a case where there is no region of interest.

FIG. 15 is a schematic diagram illustrating a configuration of a substantial part of an imaging device according to an example 5.

MODE FOR CARRYING OUT THE INVENTION

Figure 1:
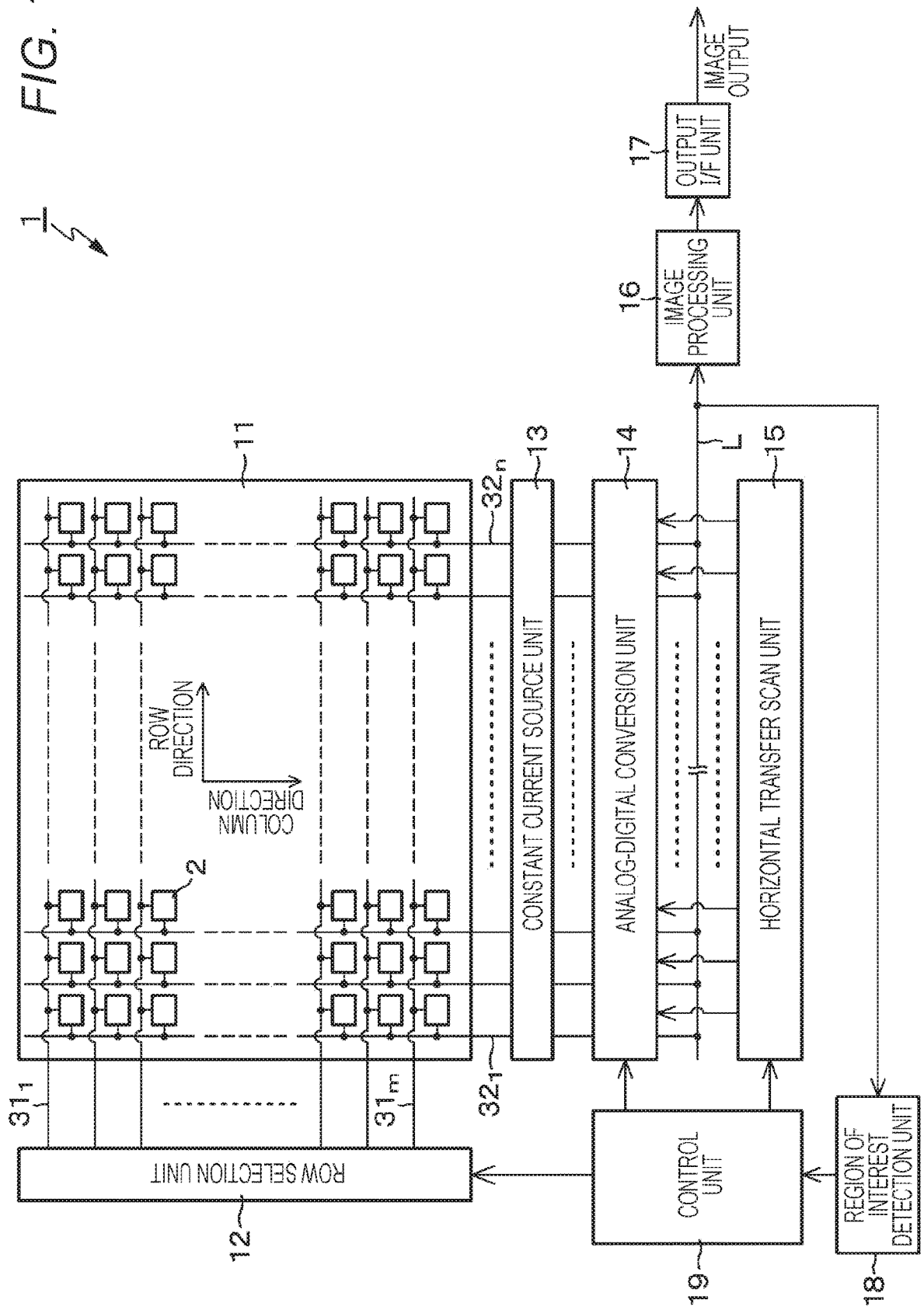
FIG. 1 is a block diagram illustrating an outline of a system configuration of an imaging device according to an embodiment of the present disclosure.

Hereinafter, a mode for carrying out the technology of the present disclosure (hereinafter referred to as an "embodiment") is described in detail with reference to the drawings. The technology of the present disclosure is not limited to the embodiment, and various numerical values in the embodiment are illustrative. In the following description, the same reference sign is used for the same elements or elements having the same function, and the description thereof is not repeated. Note that, the description is given in the following order.

1. Description regarding imaging device and driving method thereof according to present disclosure in general 2. Imaging device according to embodiment of present disclosure 2-1. System configuration 2-2. Circuit configuration of pixel 2-3. Example 1 (example in which low-resolution readout and high-resolution readout are combined)

2-4. Example 2 (example in which technology of detecting motion is used to detect region of interest)

2-5. Example 3 (variation of Example 1: another pixel configuration example of pixel unit)

2-6. Example 4 (variation of Example 1: another example of high-resolution readout)

2-7. Example 5 (example in which pixel unit includes pixels of same color separated from each other)

3. Variation

4. Application Example

5. Application example (imaging system)

6. Configuration that present disclosure may take

<Description Regarding Imaging Device and Driving Method Thereof According to Present Disclosure in General>

In an imaging device and a driving method thereof according to the present disclosure, it may be configured to detect a region with motion in a taken image as a region of interest. Then, it may be configured to, when detecting the region of interest, detect the region with motion in the taken image on the basis of a result of comparison between image information of a current imaging frame and image information of at least one imaging frame before.

In the imaging device according to the present disclosure including the above-described preferable configuration, a detection unit may include an image memory, a comparison unit, a motion amount memory, and a region of interest determination unit. The image memory holds the image information of at least one imaging frame before. The comparison unit obtains a difference absolute value between the image information of the current imaging frame and the image information held in the image memory. The motion amount memory stores the difference absolute value obtained by the comparison unit as a motion amount from a past image to a current image. The region of interest determination unit determines the region of interest on the basis of the motion amount stored in the motion amount memory.

In the imaging device and the driving method thereof according to the present disclosure including the above-described preferable configuration, it may be configured to, when detecting the region of interest, detect the region with motion in the taken image using image information at second pixel resolution.

Furthermore, in the imaging device and the driving method thereof according to the present disclosure including the above-described preferable configuration, it may be configured to, when a plurality of pixels in a pixel array unit is made a pixel unit, selectively set a first operation mode to add a plurality of pixel signals in the pixel unit to supply to an analog-digital conversion unit and a second operation mode to independently supply the plurality of pixel signals to the analog-digital conversion unit. At that time, it is preferable to set the first operation mode for the region of interest and set the second operation mode for a region other than the region of interest.

Furthermore, in the imaging device and the driving method thereof according to the present disclosure including the above-described preferable configuration, the plurality of pixels in the pixel unit may be configured to share one vertical signal line between the pixels and include a control switch which selectively connects the pixels to the vertical signal line. Then, it may be configured to selectively set the first operation mode and the second operation mode by on/off control of each control switch of the plurality of pixels.

Furthermore, in the imaging device and the driving method thereof according to the present disclosure including the above-described preferable configuration, the plurality of pixels of the pixel unit may include pixels of the same color adjacent to each other. Alternatively, as for the plurality of pixels of the pixel unit, the plurality of pixels of the pixel unit may include the pixels of the same color separated from each other with a pixel of another color interposed therebetween.

Imaging Device According to Embodiment of Present Disclosure

A system configuration of the imaging device according to the embodiment of the present disclosure is described. In this embodiment, a complementary metal oxide semiconductor (CMOS) image sensor, which is one type of an X-Y address imaging device, is described as an example of the imaging device. The CMOS image sensor is an image sensor fabricated by applying or partially using a CMOS process.

<System Configuration>

FIG. 1 is a block diagram illustrating an outline of the system configuration of the imaging device according to the embodiment of the present disclosure. As illustrated in FIG. 1, an imaging device 1 according to this embodiment includes a pixel array unit 11 and a peripheral circuit unit arranged around the pixel array unit 11. As the peripheral circuit unit, for example, a row selection unit 12, a constant current source unit 13, an analog-digital conversion unit 14, a horizontal transfer scan unit 15, an image processing unit 16, an output interface (I/F) 17, a region of interest detection unit 18, a control unit 19 and the like are provided.

In the pixel array unit 11, pixels 2 each including a photoelectric conversion unit are two-dimensionally arranged in a row direction and in a column direction, that is, in a matrix. Here, the row direction is intended to mean an array direction of the pixels 2 in a pixel row (a so-called horizontal direction), and the column direction is intended to mean an array direction of the pixels 2 in a pixel column (a so-called vertical direction). The pixel 2 performs photoelectric conversion to generate and accumulate photocharges according to an amount of received light. A specific circuit configuration of the pixel 2 is described later.

In the pixel array unit 11, pixel drive lines $31_1$ to $31_m$ (hereinafter, they are sometimes collectively referred to as "pixel drive lines 31") are wired in the row direction for the respective pixel rows in a pixel array in a matrix. Furthermore, vertical signal lines $32_1$ to $32_n$ (hereinafter, they are sometimes collectively referred to as "vertical signal lines 32") are wired in the column direction for the respective pixel columns. The pixel drive line 31 transfers a drive signal for driving when reading out a signal from the pixel 2. In FIG. 1, the pixel drive line 31 is illustrated as one wire, but this is not limited to one wire. One end of the pixel drive line 31 is connected to an output end corresponding to each row of the row selection unit 12.

Each circuit unit of the peripheral circuit unit of the pixel array unit 11, that is, the row selection unit 12, the constant current source unit 13, the analog-digital conversion unit 14, the horizontal transfer scan unit 15, the image processing unit 16, the output I/F 17, the region of interest detection unit 18, and the control unit 19 are hereinafter described.

The row selection unit 12 includes a shift register, an address decoder and the like, and drives the pixels 2 of the pixel array unit 11 simultaneously for all the pixels, row by row and the like under the control of the control unit 19. Each pixel 2 of the pixel array unit 11 is selected by the row selection unit 12 in units of pixel rows, so that a pixel signal is read out from each pixel 2 of the selected pixel row.

The constant current source unit 13 includes a set of current sources I including MOS transistors connected to the vertical signal lines $32_1$ to $32_n$, respectively, for each pixel column (refer to FIG. 2), and supplies a bias current to each pixel 2 of the pixel row selectively scanned by the row selection unit 12 through each of the vertical signal lines $32_1$ to $32_n$. The pixel signals read out from the respective pixels 2 of the pixel array unit 11 in units of pixel rows are supplied to the analog-digital conversion unit 14 through the vertical signal lines $32_1$ to $32_n$, respectively.

The analog-digital conversion unit 14 includes a set of a plurality of analog-digital converters (ADCs) 141 (refer to FIG. 3) provided corresponding to the vertical signal lines $32_1$ to $32_n$, respectively, and converts analog pixel signals output for each pixel column to digital signals. That is, the analog-digital conversion unit 14 is a column-parallel analog-digital conversion unit in which a plurality of analog-digital converters 141 is arranged in parallel corresponding to the pixel columns.

A well-known analog-digital converter may be used as the analog-digital converter 141. Specifically, as the analog-digital converter 141, a single slope analog-digital converter, a successive approximation analog-digital converter, or a delta-sigma modulation (ΔΣ modulation) analog-digital converter which are examples of a reference signal comparison analog-digital converter may be exemplified. However, the analog-digital converter is not limited to them.

In the analog-digital conversion unit 14, the analog-digital converter 141 may be arranged in a one-to-one relationship with respect to the pixel column, that is, may be arranged for each pixel column, or one analog-digital converter may be arranged for a plurality of pixel columns. In this embodiment, one analog-digital converter 141 is arranged for every horizontal two pixels (two pixel columns) (refer to FIG. 3). In this case, analog-digital conversion is performed twice for obtaining pixel data of one row.

The analog-digital converter 141 has a large gate size and large power consumption of the transistor forming the same. Here, power in a case where one analog-digital converter performs the analog-digital conversion once for one pixel, and power in a case where one analog-digital converter performs the analog-digital conversion twice for two pixels may be considered as equivalent. That is, in a case where the analog-digital conversion is performed for the same number of pixels, if the parallel number of the analog-digital converters is small, individual power consumption is small, but since the analog-digital conversions is performed plural times, total power consumption is equivalent.

The analog-digital conversion unit 14 includes a latch circuit which latches the pixel data after the analog-digital conversion in a readout period of the pixel signal from each pixel 2 of the pixel array unit 11 on an output stage of the analog-digital converter 141.

The horizontal transfer scan unit 15 includes a shift register, an address decoder and the like, and controls scanning of the pixel column and an address of the pixel column when reading out the signal of each pixel 2 of the pixel array unit 11. Under the control of the horizontal transfer scan unit 15, the pixel data converted into the digital signals by the analog-digital conversion unit 14 and latched by the latch circuit is read out to a horizontal transfer line L in units of pixel columns.

The pixel data read out to the horizontal transfer line L is subjected to predetermined image processing by the image processing unit 16, and then output through the output I/F 17. The pixel data read out to the horizontal transfer line L is further directly supplied to the region of interest detection unit 18.

The region of interest detection unit 18 is a detection unit which detects a specific region in the taken image from image contents as a region of interest (ROI) or a focused region on the basis of the pixel data supplied through the horizontal transfer line L. The region of interest detection unit 18 may detect the region with motion in the taken image as the region of interest (focused region) by using, for example, a well-known technology of detecting motion. However, the technology of detecting the region of interest is not limited to the technology of detecting motion.

In a case where the technology of detecting motion is used, it is necessary to hold the image information of at least one imaging frame before. Therefore, the region of interest detection unit 18 includes a built-in image memory which stores the image information of at least one imaging frame before. The region of interest detection unit 18 detects the region with motion in the taken image as the region of interest on the basis of the result of comparison between the image information of the current imaging frame and the image information of at least one imaging frame before held in the image memory, and provides region of interest information to the control unit 19.

The control unit 19 generates various timing signals, clock signals, control signals and the like, and performs drive control of the row selection unit 12, the analog-digital conversion unit 14, the horizontal transfer scan unit 15 and the like on the basis of the generated signals. Furthermore, the control unit 19 controls the selected pixel row and the pixel resolution on the basis of the region of interest information provided by the region of interest detection unit 18. The control of the pixel row and the pixel resolution is described later in detail.

The imaging device 1 having the above-described configuration may obtain an image through a lens (not illustrated). Then, under drive by the row selection unit 12, the analog-digital conversion unit 14 performs the analog-digital conversion for each pixel row, and under drive by the horizontal transfer scan unit 15, the pixel data of the row is sequentially scanned, so that an image of one screen may be obtained.

The pixel row from which the pixel signals are read out has the address, and this is a row address incremented from below upward in the drawing on the circuit. In general, a Kepler lens is used as the above-described lens, and an image is a mirror image. Therefore, assuming that the image is the mirror image, a lower portion on the circuit is located in a higher portion on the image, and the row address is incremented from above downward on the image.

In the imaging device 1 having the above-described configuration, a chip structure may be a so-called flat structure or a so-called stacked structure.

Here, the flat structure is the chip structure in which the peripheral circuit unit of the pixel array unit 11, that is, the row selection unit 12, the constant current source unit 13, the analog-digital conversion unit 14, the horizontal transfer scan unit 15, the image processing unit 16, the output I/F 17, the region of interest detection unit 18, and the control unit 19 are formed on the same semiconductor substrate (semiconductor chip) as the pixel array unit 11.

Furthermore, the stacked structure is the chip structure in which the peripheral circuit unit of the pixel array unit 11 is formed on at least one semiconductor substrate different from the semiconductor substrate on which the pixel array unit 11 is formed. According to the imaging device 1 having this laminated structure, a size (area) of a first-layer semiconductor substrate on which the pixel array unit 11 may be formed is sufficient, so that the size (area) of the first-layer semiconductor substrate, and eventually, a size of an entire chip may be reduced. Moreover, since a process suitable for fabricating the pixel 2 may be applied to the first-layer semiconductor substrate and a process suitable for fabricating a circuit portion may be applied to other semiconductor substrates, there also is an advantage that the process may be optimized when manufacturing the imaging device 1.

<Circuit Configuration of Pixel>

Figure 2:
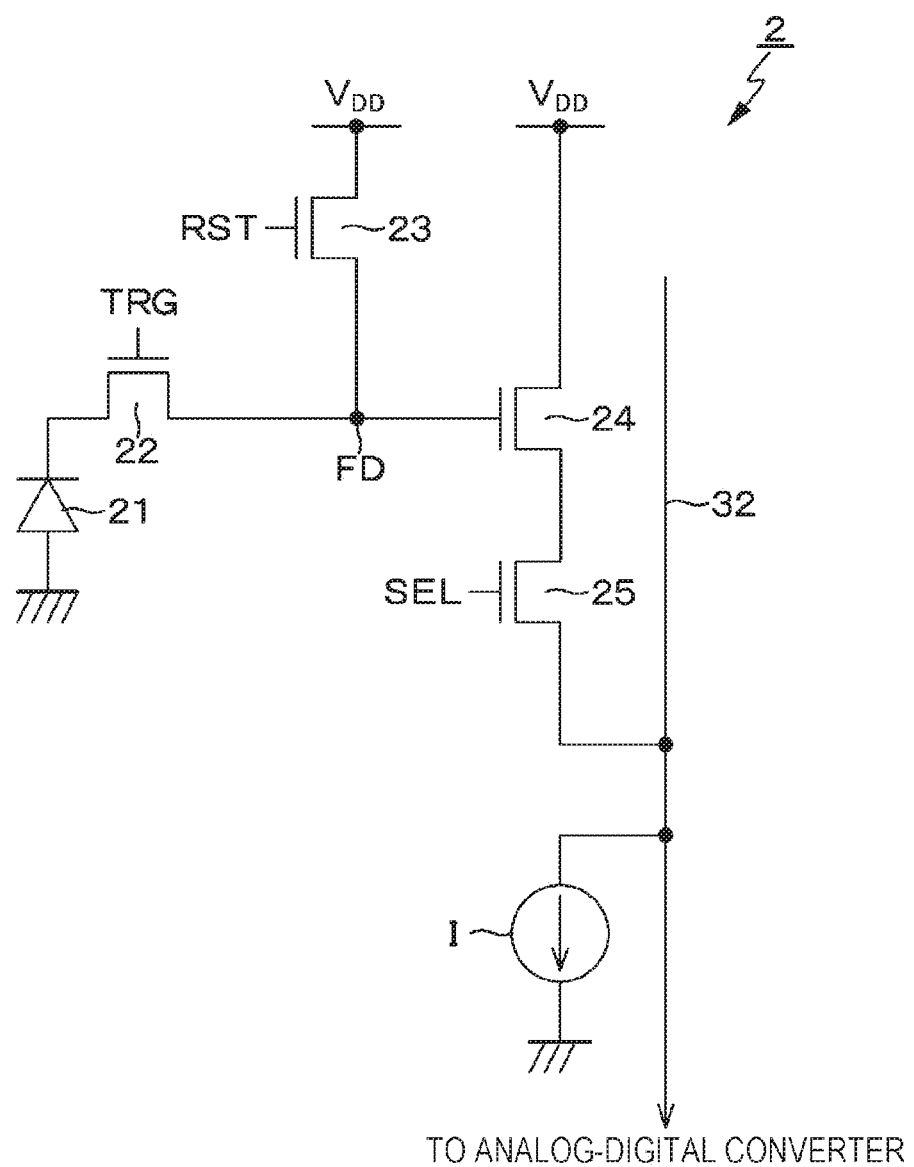
FIG. 2 is a circuit diagram illustrating an example of a circuit configuration of a pixel.

FIG. 2 is a circuit diagram illustrating an example of a circuit configuration of the pixel 2. The pixel 2 includes, for example, a photodiode 21 as the photoelectric conversion unit, and has the circuit configuration including a transfer transistor 22, a reset transistor 23, an amplification transistor 24, and a selection transistor 25 in addition to the photodiode 21.

Note that, here, N-channel MOS field-effect transistors are used, for example, as four transistors of the transfer transistor 22, the reset transistor 23, the amplification transistor 24, and the selection transistor 25. However, a combination of conductivity types of the four transistors 22 to 25 herein exemplified is merely an example and the combination is not limited thereto.

Regarding the pixels 2, as the above-described pixel drive lines 31, a plurality of pixel drive lines is wired in common to the pixels 2 in the same pixel row. The plurality of pixel drive lines is connected to the output terminals corresponding to the respective pixel rows of the row selection unit 12 for each pixel row. The row selection unit 12 appropriately outputs a transfer signal TRG, a reset signal RST, and a selection signal SEL to the plurality of pixel drive lines.

The photodiode 21 an anode electrode of which is connected to a low potential side power supply (for example, ground) photoelectrically converts the received light into the photocharges (herein, photoelectrons) of a charge amount corresponding to the amount of light and accumulates the photocharges. A cathode electrode of the photodiode 21 is electrically connected to a gate electrode of the amplification transistor 24 via the transfer transistor 22. Here, a region where the gate electrode of the amplification transistor 24 is electrically connected is a floating diffusion (floating diffusion region/impurity diffusion region) FD. The floating diffusion FD is a charge-voltage conversion unit which converts charges into a voltage.

To a gate electrode of the transfer transistor 22, the transfer signal TRG in which a high level (for example, $V_{DD}$ level) is active is supplied from the row selection unit 12. When the transfer transistor 22 is put into a conductive state in response to the transfer signal TRG, this transfers the photocharges photoelectrically converted by the photodiode 21 and accumulated in the photodiode 21 to the floating diffusion FD.

The reset transistor 23 is connected between a node of a high-potential side power supply $V_{DD}$ and the floating diffusion FD. To a gate electrode of the reset transistor 23, the reset signal RST in which a high level is active is supplied from the row selection unit 12. The reset transistor 23 is put into a conductive state in response to the reset signal RST, and resets the floating diffusion FD by discharging the charge of the floating diffusion FD to the node of the voltage $V_{DD}$.

The amplification transistor 24 is such that the gate electrode is connected to the floating diffusion FD and a drain electrode is connected to the node of the high-potential side power supply $V_{DD}$. The amplification transistor 24 serves as an input unit of a source follower which reads out a signal obtained by the photoelectric conversion in the photodiode 21. That is, a source electrode of the amplification transistor 24 is connected to the vertical signal line 32 through the selection transistor 25. Then, the amplification transistor 24 and the current source I connected to one end of the vertical signal line 32 form the source follower which converts the voltage of the floating diffusion FD into potential of the vertical signal line 32.

A drain electrode and a source electrode of the selection transistor 25 are connected to the source electrode of the amplification transistor 24 and the vertical signal line 32, respectively, for example. To a gate electrode of the selection transistor 25, the selection signal SEL in which a high level is active is supplied from the row selection unit 12. When the selection transistor 25 is put into a conductive state in response to the selection signal SEL, this puts the unit pixel 2 into a selected state and transfers the signal output from the amplification transistor 24 to the vertical signal line 32.

Note that, as the pixel circuit of the pixel 2, a 4 Tr circuit configuration including the transfer transistor 22, the reset transistor 23, the amplification transistor 24, and the selection transistor 25, that is four transistors (Trs) is herein described as an example; however, this is not limited to the 4 Tr circuit configuration. Furthermore, as the pixel structure, when a substrate surface on a side on which a wiring layer is provided is a front surface (front), it is also possible to use a back surface irradiation pixel structure which captures irradiation light from a back surface side opposite to the front surface, or may use a front surface irradiation pixel structure which captures irradiation light from a front surface side.

In the above description, the system configuration of a general imaging device in which one vertical signal line 32 is wired for each pixel column is described as an assumption, but the imaging device 1 according to this embodiment adopts a system configuration in which a plurality of pixels of the pixel array unit 11 is made a unit (hereinafter, referred to as a "pixel unit") and one vertical signal line 32 is shared by the plurality of pixels in the pixel unit.

Furthermore, the imaging device 1 according to this embodiment includes the region of interest detection unit 18 which detects the specific region in the taken image as the region of interest. Then, the imaging device 1 according to this embodiment reads out the pixel signals at first pixel resolution in the region including the region of interest detected by the region of interest detection unit 18, and reads out the pixel signals at second pixel resolution lower than the first pixel resolution in the region not including the region of interest under the control of the control unit 19.

Hereinafter, the first pixel resolution is referred to as high resolution, and the second pixel resolution is referred to as low resolution. Specific examples of this embodiment are described below.

Example 1

Figure 3:
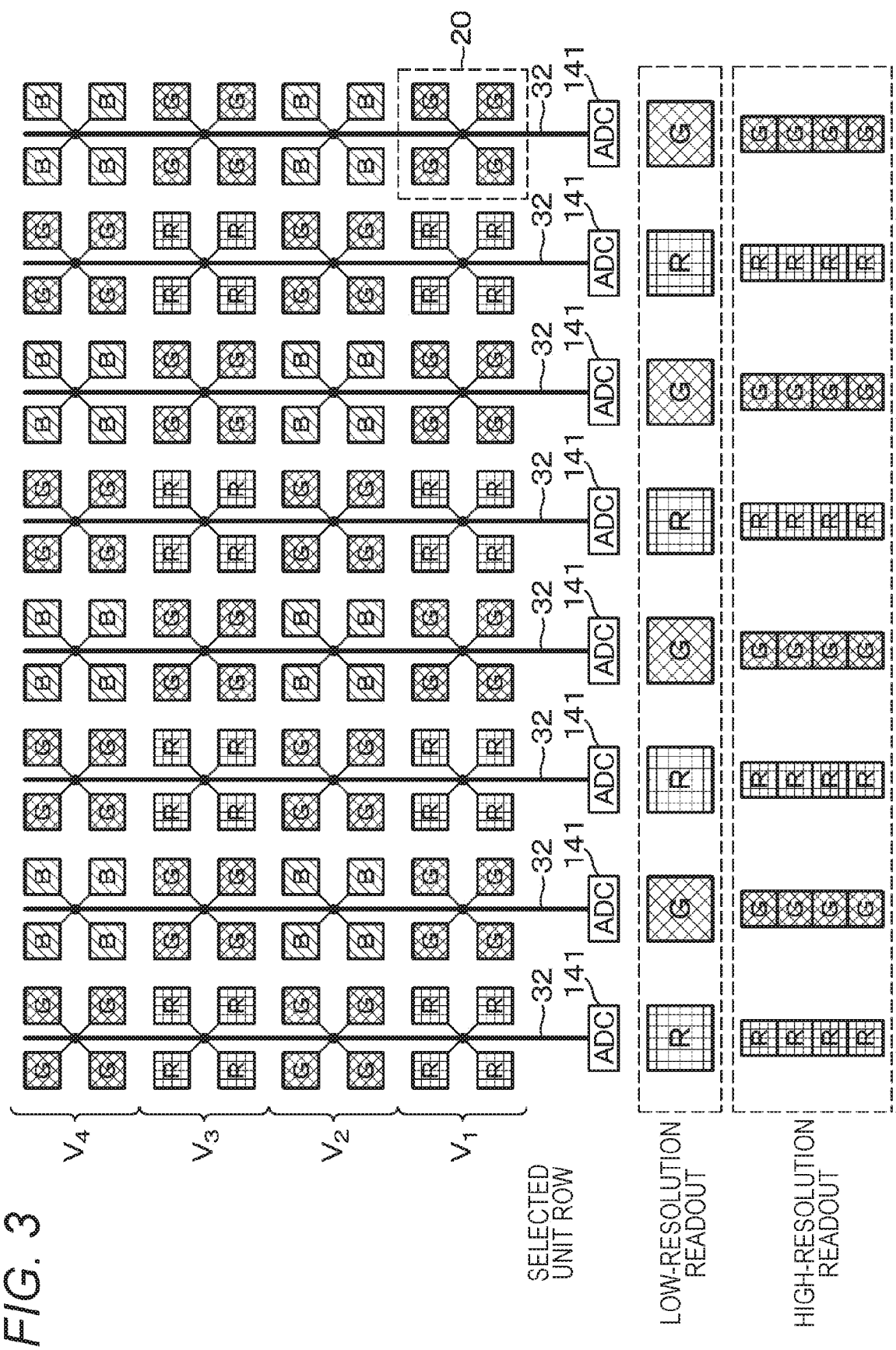
FIG. 3 is a schematic diagram illustrating a configuration of a substantial part of an imaging device according to an example 1.

An example 1 is an example in which a plurality of pixels of the same color adjacent to each other, for example, horizontal two pixels×vertical two pixels (pixels of two columns×two rows) is made one pixel unit 20, and a plurality of pixels in the pixel unit 20 shares one vertical signal line 32. FIG. 3 illustrates a configuration of a substantial part of an imaging device according to the example 1. Here, a case where the pixel unit 20 including horizontal two pixels×vertical two pixels is made a color unit and a color array is a Bayer array of red R, green G, and blue B is illustrated.

Figure 4A:
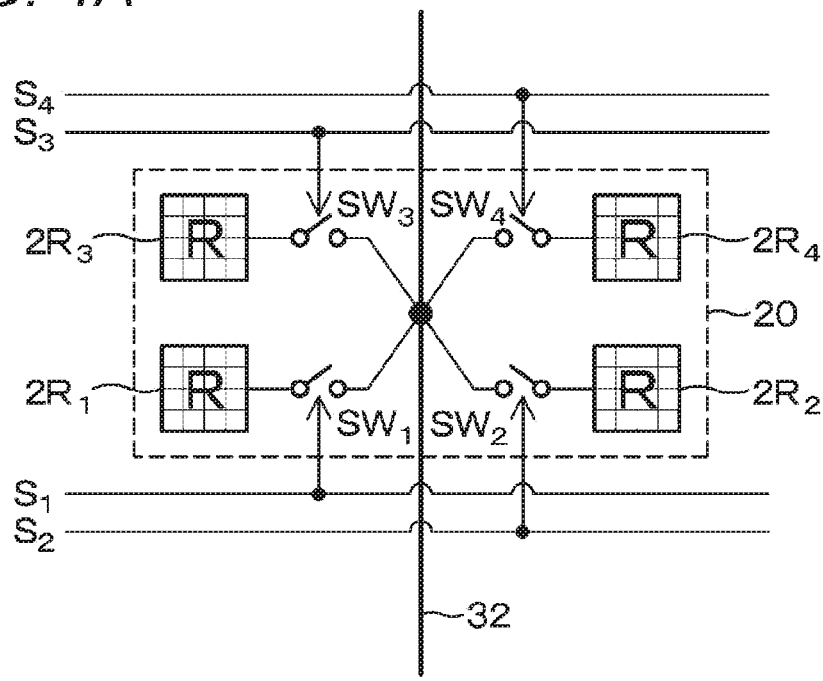
FIG. 4A is a configuration diagram for selecting pixels in one pixel unit.
Figure 4B:
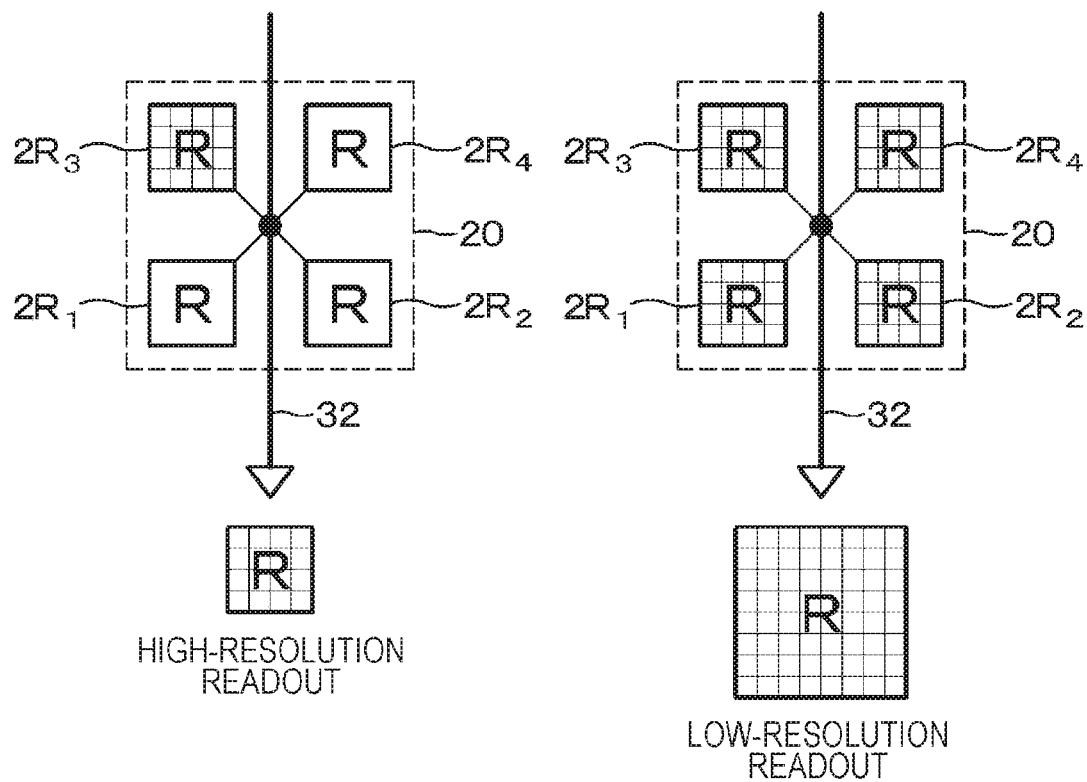
FIG. 4B is a conceptual diagram of high-resolution readout and low-resolution readout by a control switch.

FIG. 4A is a configuration diagram for selecting pixels in one pixel unit 20, and FIG. 4B is a conceptual diagram of high-resolution readout and low-resolution readout by a control switch. In FIGS. 4A and 4B, for example, four pixels $2R_1$ to $2R_4$ including horizontal two×vertical two red R pixels are illustrated.

As illustrated in FIG. 3, in a pixel array unit in which the pixel units 20 each including the four pixels including horizontal two pixels×vertical two pixels are arranged in a Bayer array of red R, green G, and blue B, a row in units of the pixel units 20 is referred to as a unit row. Then, under the control of a control unit 19, unit row selection signals $V_1$, $V_2$, $V_3$, ... are provided from a row selection unit 12 to the respective unit rows to select the unit row.

Furthermore, as illustrated in FIG. 4A, the four pixels $2R_1$ to $2R_4$ in the pixel unit 20 share one vertical signal line 32 among the pixels and include control switches $SW_1$ to $SW_4$ which selectively connect them to the vertical signal line 32, respectively. The control switches $SW_1$ to $SW_4$ are connected between a selection transistor 25 and the vertical signal line 32 illustrated in FIG. 2 and are subjected to on/off control by switch control signal $S_1$ to $S_4$ appropriately provided from the row selection unit 12 under the control of the control unit 19.

Figure 5:
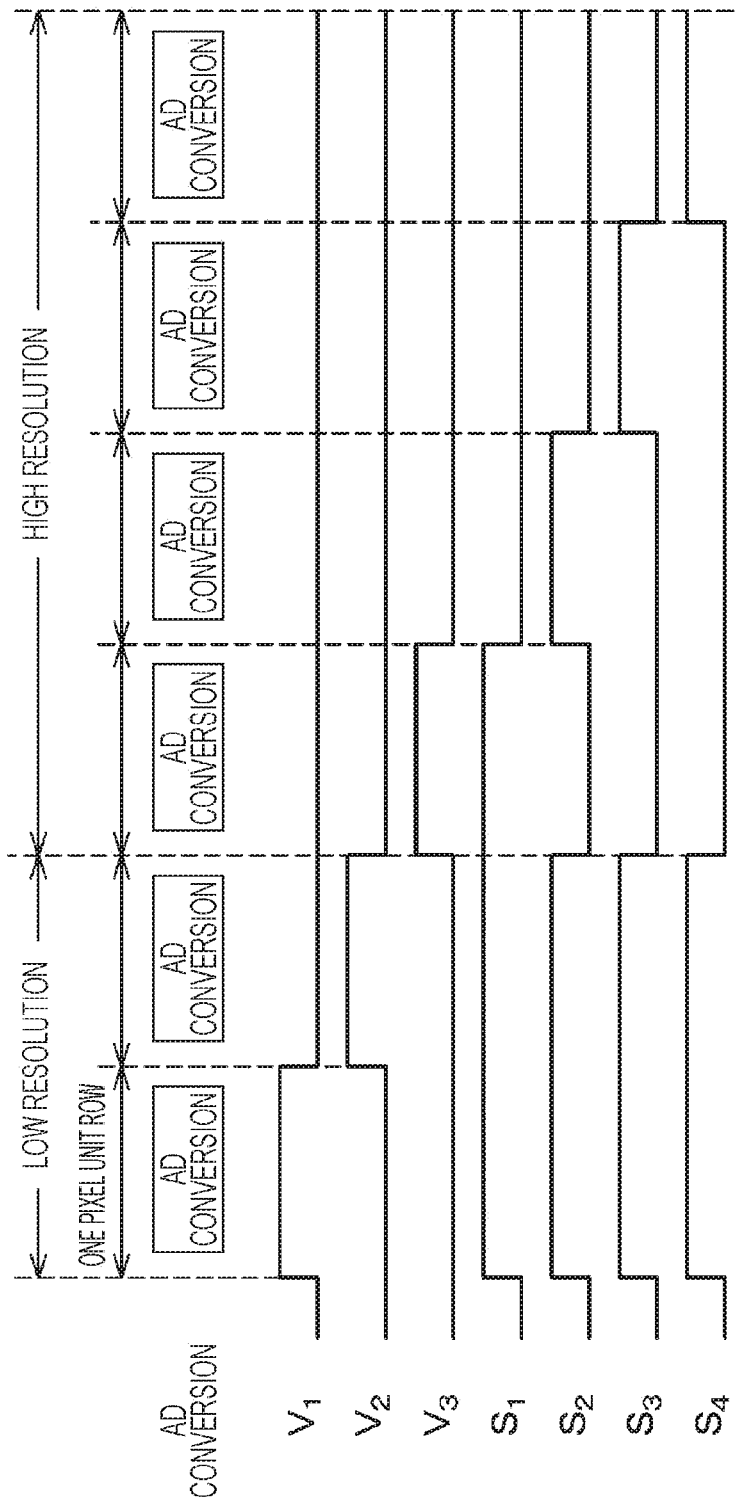
FIG. 5 is a timing waveform chart illustrating a timing relationship of unit row selection signals $V_1$, $V_2$, and $V_3$ and switch control signals $S_1$ to $S_4$.

FIG. 5 illustrates a timing relationship of the unit row selection signals $V_1$, $V_2$, and $V_3$ and the switch control signals $S_1$ to $S_4$.

In the imaging device according to the example 1 having the above-described configuration, an operation is performed in which signals of the four pixels $2R_1$ to $2R_4$ in the pixel unit 20 are simultaneously read out to the vertical signal line 32 to be added by turning on all of the control switches $SW_1$ to $SW_4$ under the control of the control unit 19 (first operation mode). According to this first operation mode, the signals of the four pixels $2R_1$ to $2R_4$ in the pixel unit 20 are added at an analog level, and the added signals are supplied to an analog-digital converter 141 arranged for every two pixel columns. That is, the first operation mode is a low-resolution readout mode in which signals of four pixels are read out as a signal of one pixel as illustrated on a right side in FIG. 4B.

Furthermore, an operation is performed in which the signals of the four pixels $2R_1$ to $2R_4$ are sequentially read out to the vertical signal line 32 to be supplied to the analog-digital converter 141 in units of pixels by sequentially turning on the control switches $SW_1$ to $SW_4$ by the switch control signals $S_1$ to $S_4$, respectively, under the control of the control unit 19 (second operation mode). The second operation mode is a high-resolution readout mode in which the signals of the four pixels $2R_1$ to $2R_4$ are read out in units of pixels as illustrated on a left side in FIG. 4B.

In the high-resolution readout, the readout of the pixel signals is realized by performing the analog-digital conversion four times on the four pixels $2R_1$ to $2R_4$. On the other hand, in the low-resolution readout, the readout of the pixel signals is realized by performing the analog-digital conversion once on the four pixels $2R_1$ to $2R_4$. Therefore, in the first operation mode of the low-resolution readout, the pixel signals may be read out with one-quarter the readout time and one-quarter the power consumption as compared with those in the second operation mode of the high-resolution readout.

As illustrated in FIG. 5, the analog-digital conversion is performed in units of one pixel unit row. At the time of low-resolution readout, the analog-digital conversion is performed on a signal obtained by adding the signals of the four pixels $2R_1$ to $2R_4$, so that data of one pixel unit row may be obtained by one analog-digital conversion operation. In the low-resolution readout, the pixel signals are added, so that the switches $SW_1$ to $SW_4$ are simultaneously turned on and the signals of the four pixels $2R_1$ to $2R_4$ are read out simultaneously. On the other hand, in the high-resolution readout, in order to read out the signals of the four pixels $2R_1$ to $2R_4$ one pixel at a time, the switches $SW_1$ to $SW_4$ are individually turned on, and the analog-digital conversion is sequentially performed.

Figure 6:
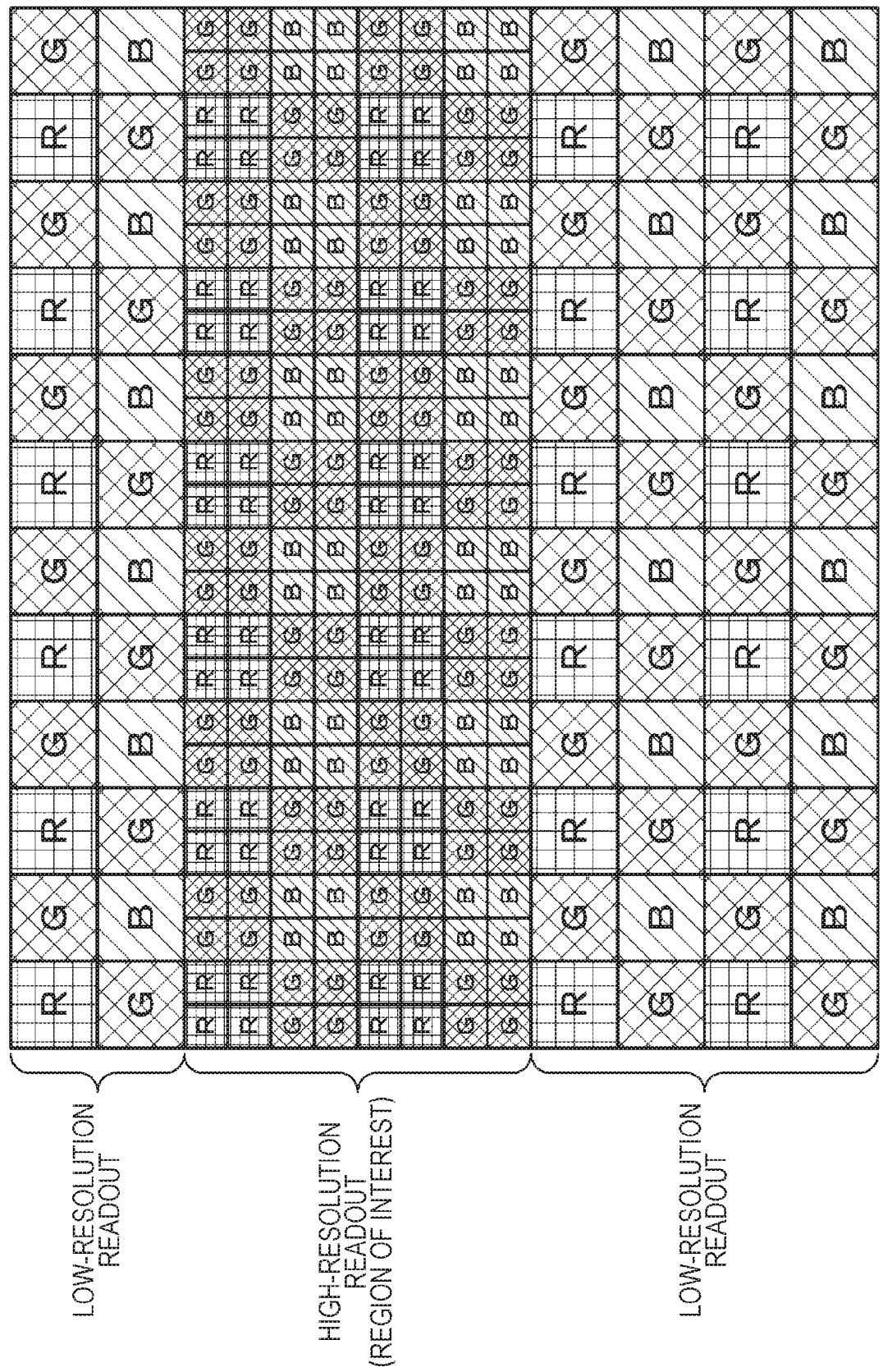
FIG. 6 is a view illustrating a readout image of pixel signals in a case where the low-resolution readout and the high-resolution readout are combined.

FIG. 6 illustrates a readout image of the pixel signals in a case where the low-resolution readout and the high-resolution readout are combined. By combining control of the low-resolution readout and control of the high-resolution readout, an image at high resolution by the high-resolution readout is obtained for a portion of a region of interest. Furthermore, as for a portion other than the region of interest, an operation of reading out at low resolution is realized.

Example 2

An example 2 is an example of a circuit configuration of a region of interest detection unit 18 which uses a technology of detecting motion when detecting a region of interest.

FIG. 7 illustrates an example of a circuit configuration of a region of interest detection unit according to the example 2. Furthermore, (FIGS. 8A, 8B, 8C, and 8D are conceptual diagrams of detection of the region of interest using the technology of detecting motion.

The region of interest detection unit 18 includes an image memory 181, a comparison unit 182, a motion amount memory 183, and a region of interest determination unit 184.

Figure 8A:
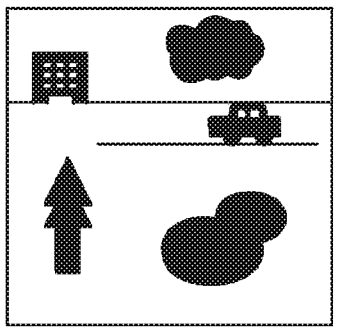
FIGS. 8A, 8B, 8C, and 8D are conceptual diagrams regarding detection of a region of interest using a technology of detecting motion.

In the region of interest detection unit 18 having the above-described configuration, the image memory 181 holds image information of at least one imaging frame before as past image information (FIG. 8A). The comparison unit 182 compares the past image information (FIG. 8A) held in the image memory 181 with current image information (FIG. 8B), takes a difference absolute value between the same pixel units, and obtains a difference absolute value image (FIG. 8C). The current image information is stored in the image memory 181 for a comparison operation in a next imaging frame.

Figure 8B:
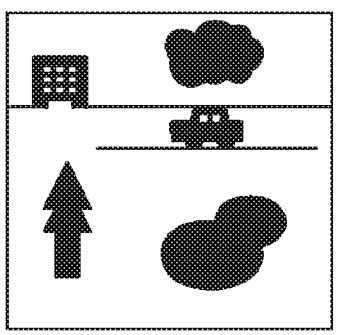
Figure 8C:
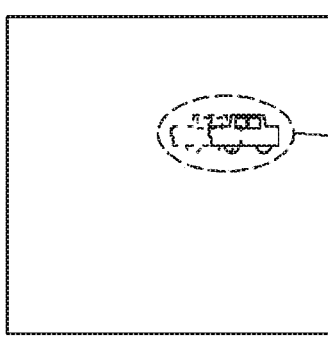

The difference absolute value image (FIG. 8C) obtained by the comparison operation by the comparison unit 182 is stored in the motion amount memory 183 as a motion amount from a past image (FIG. 8A) to a current image (FIG. 8B). By using a reduced image as a unit of storage and comparison of the image information, the image memory 181 and the circuit may be significantly downsized.

The region of interest determination unit 184 determines that there is motion in a portion in which the motion amount is larger than a predetermined amount on the basis of the motion amount stored in the motion amount memory 183, detects the portion as the region of interest, and supplies region of interest information to a control unit 19.

Figure 8D:
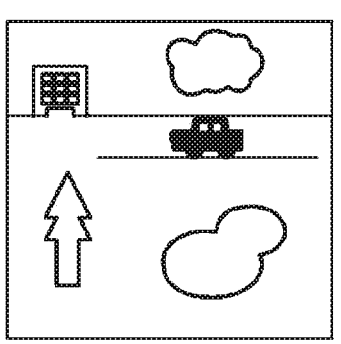

The control unit 19 which receives the region of interest information from the region of interest detection unit 18 performs control to read out a pixel signal of a portion of the region of interest by high-resolution readout and performs control to read out a pixel signal of a portion other than the region of interest by low-resolution readout (FIG. 8D).

Here, it is preferable that the region of interest detection unit 18 detects a region with motion in a taken image by using image information at low resolution which is second pixel resolution. Specifically, at least, the image data is stored in the image memory 181 and compared by the comparison unit 182 using a reduction ratio corresponding to the low resolution which is the second resolution, or a reduction ratio higher than this. This makes it possible to match the high-resolution readout to the low-resolution readout. The difference absolute value image (FIG. 8C) may be stored at granularity of each pixel unit 20, but in this embodiment, this is stored in the motion amount memory 183 for each pixel unit row.

Next, readout control adapted to the region of interest (ROI) is described. First, row address motion in a case where there is no region of interest is described with reference to FIG. 9. In FIG. 9, a view on a left side is a graph in which time is plotted along the abscissa and the row address is plotted along the ordinate.

The row address makes a transition from a small value to a large value in sequence, and since the pixel signals of all the pixels are obtained by high-resolution readout, it takes time at a constant rate. A shaded portion in the graph represents exposure for each row, a line on a left side of a parallelogram represents a pixel reset (reset) timing, and a line on a right side represents a pixel signal readout (readout) timing.

In FIG. 9, a view on a right side is a view illustrating an image in which a black-painted portion represents an image obtained by high-resolution readout. Physical positions of the row address in the view on the left side and the image in the view on the right side are illustrated to match. The analog-digital conversion is performed when reading out the pixel signal, and a period thereof is represented by "AD conversion (high power)". Since power consumption is high in this AD conversion period, reducing this time leads to realization of power saving.

Figure 10:
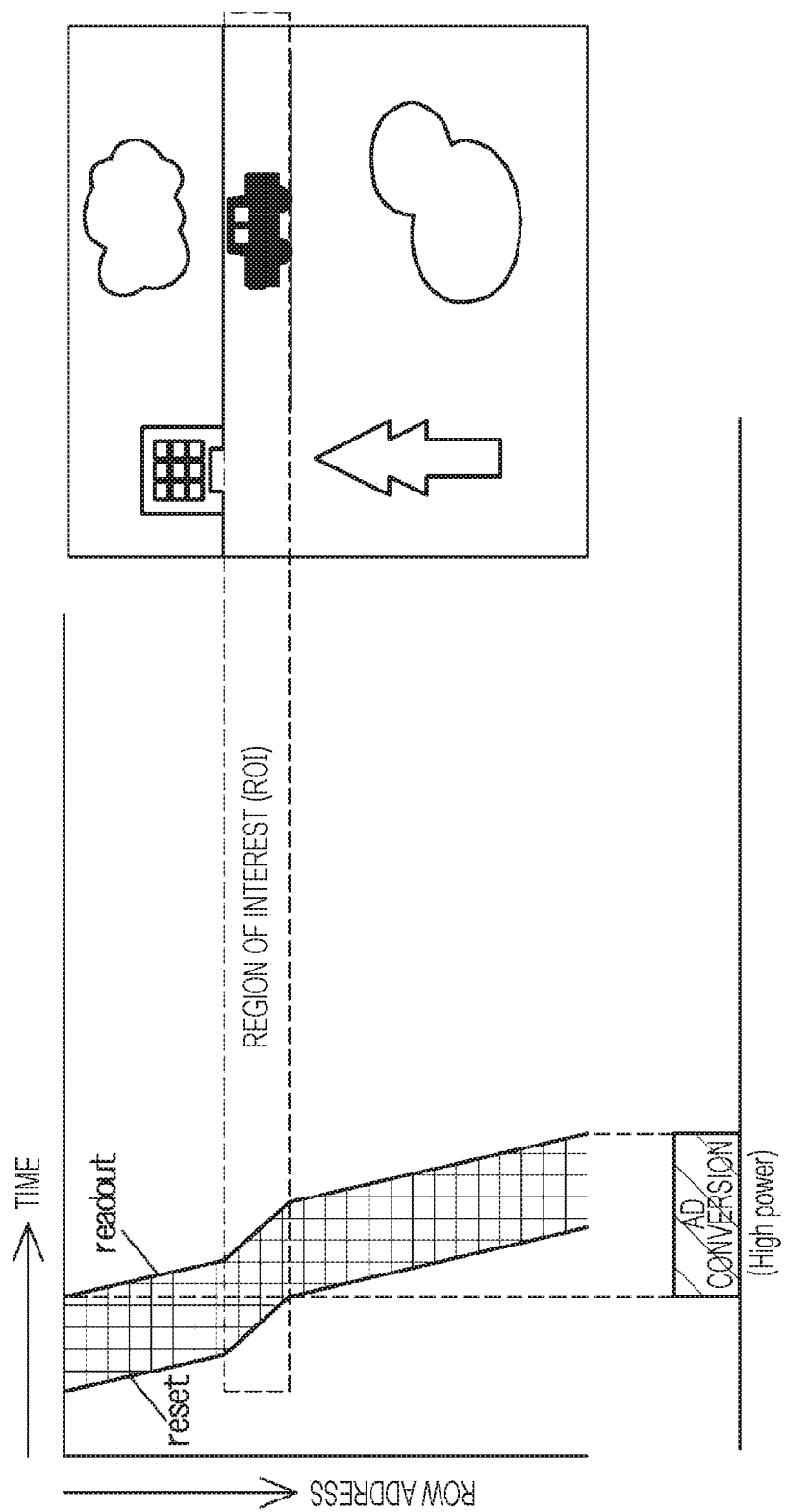
FIG. 10 is a view illustrating row address motion in a case where there is a region of interest.

Next, the row address motion in a case where there is the region of interest is described with reference to FIG. 10. In FIG. 10 also, a view on a left side is a graph in which time is plotted along the abscissa and the row address is plotted along the ordinate as in FIG. 9.

As for the portion other than the region of interest, it is driven by the low-resolution readout, and an image is drawn as a white outline. In a case of a low-resolution readout operation, the pixel signals may be read out in one-quarter the time in this example, so that a slope of the graph is sharper than that of the graph in FIG. 9. In response to this, the AD conversion period for one screen is shortened. Therefore, in the portion other than the region of interest, by performing the low-resolution readout, the power consumption may be significantly reduced as compared with a case where the pixel signals of all the pixels are obtained by the high-resolution readout in FIG. 9.

Figure 11:
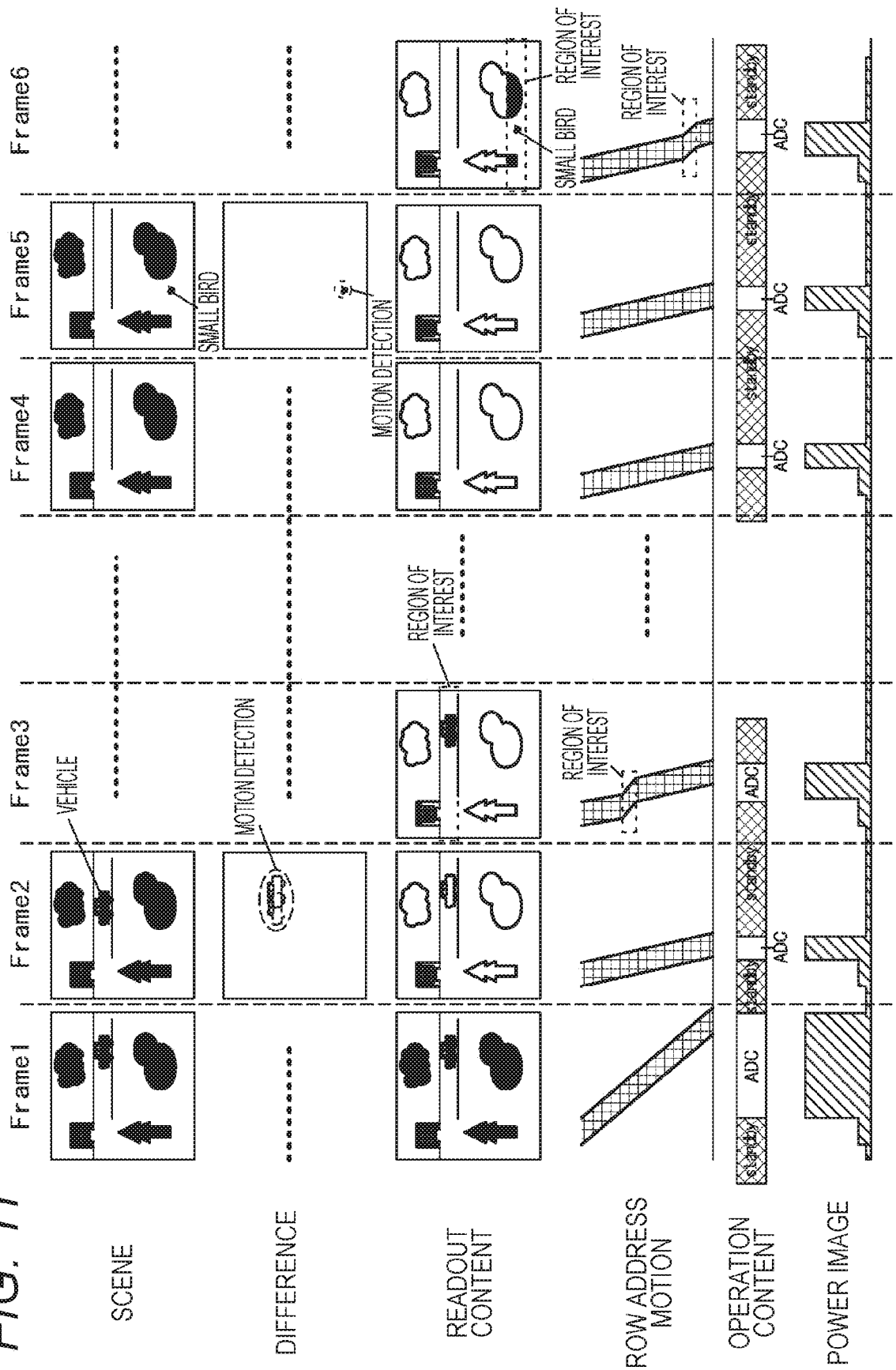
FIG. 11 is a view illustrating motion of a continuous operation that matches motion of a subject.

Next, motion of a continuous operation that matches motion of a subject is described with reference to FIG. 11. In FIG. 11, from a top stage, there are a "scene" of an actual scene image, a "difference" from the image one imaging frame before, a "readout content" of the imaging device 1, "row address motion" of the imaging device 1, an "operation content" of the imaging device 1, and a "power image" illustrating an outline of the power consumption.

In the "operation content", an AD conversion period by the analog-digital conversion unit 14 is represented as "ADC", and a period other than this is represented as "standby". The imaging device 1 consumes a large amount of power in the AD conversion by the analog-digital conversion unit 14, and normally performs processing from image processing to data output in this AD conversion period. Then, the power consumption may be reduced by shortening the AD conversion period.

A graph of the power consumption is illustrated in the "power image". From this graph, it is understood that the power consumption may be reduced by shortening the AD conversion period. In the "power image", a high portion of the graph is a portion in which power consumption is high. A large amount of power is consumed in an "ADC" period, and very small power is consumed in a "standby" period.

In a case where the readout operation of the pixel signal is performed, data motion and the like do not occur and a large amount of power is not required, but this is larger than that in the "standby" period, so that this is represented by a small height. Since the circuit does not operate in the "standby" period, an analog circuit is controlled to shift to a mode in which the power consumption is extremely small, and a digital circuit may cut off the power.

FIG. 11 illustrates a scenario from operation start (frame 1); a vehicle moves (frame 1 to frame 2), thereafter the vehicle disappears from a screen, then a small bird appears on a bank of a pond (frame 5).

The scene of the (frame 1) is an initial operation and there is no previous imaging frame, so that there is no difference information. As a readout operation of the pixel signal, since there is no region of interest, it is driven by high-resolution readout. Since an entire screen is controlled by the high-resolution readout, the analog-digital conversion period (ADC) is the longest. Since a large amount of power is consumed at the time of analog-digital conversion, in the "power image", the high portion of the graph becomes longer and the total power consumption also increases.

In the (frame 2), since it is driven as a normal operation (not the initial operation any more), the entire screen is driven by low-resolution readout. Therefore, a slope of a graph of the "row address motion" becomes sharp and the analog-digital conversion period becomes short. In a graph of the "power image" also, a portion of the high power becomes short, so that the power consumption becomes small. In this example, since the number of pixels becomes one-quarter, the power consumption is reduced to about one-quarter or smaller.

The motion of the vehicle is detected on the basis of a difference between image information of the (frame 1) and image information of the (frame 2). A position in the screen of this vehicle is reflected as the region of interest in an operation of the next imaging frame. A portion of high-resolution readout is generated, so that it becomes worse in terms of power than a case where it is entirely driven by the low-resolution readout, but an effect of power improvement is larger than that in a case where all the pixels are driven by high-resolution readout. Furthermore, since an external controller which receives this image data has received a high-resolution image in the past, it is possible to always obtain a high-resolution image by complementing by using the past image as for a portion without motion. This is a great advantage in a case of using the technology of detecting motion to detect the region of interest.

Furthermore, the imaging device 1 according to this embodiment includes the region of interest detection unit 18 which detects a specific region in the taken image as the region of interest, and the imaging device itself may detect the region of interest, so that it is easy to detect the region of interest and reflect the same to control. A change in image position of motion detection and a change in control corresponding to this are represented in the (frame 4) to the (frame 5). A situation is illustrated in which the vehicle disappears from the screen in the (frame 4) and the small bird appears on the bank of the pond in the (frame 5). It is illustrated that the motion is detected by the appearance of the small bird, the position of the region of interest changes accordingly, and the control changes in the (frame 6).

Example 3

An example 3 is a variation of the example 1 and is another pixel configuration example of one pixel unit 20. In the example 1, one pixel unit 20 includes four pixels of horizontal two pixels×vertical two pixels (pixels in two columns×two rows) (refer to FIG. 3). A first specific example of the pixel unit 20 according to the example 3 is illustrated in FIG. 12, a second specific example thereof is illustrated in FIG. 13A, and a third specific example thereof is illustrated in FIG. 13B.

Figure 12:
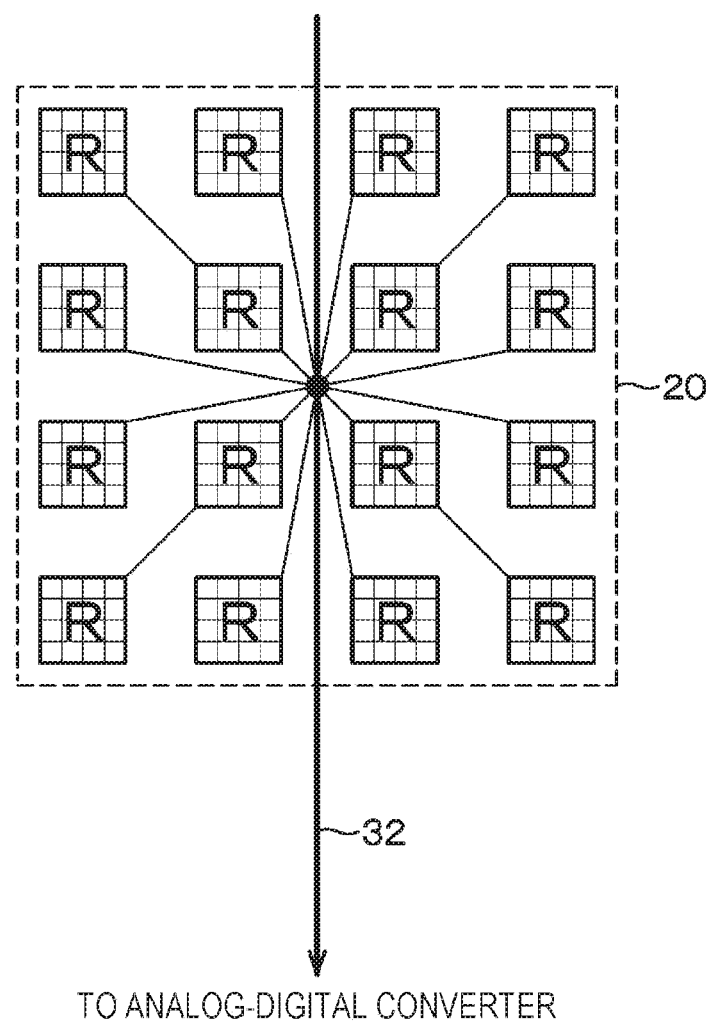
FIG. 12 is a view illustrating a pixel configuration of a pixel unit according to a first specific example of an example 3.
Figure 13A:
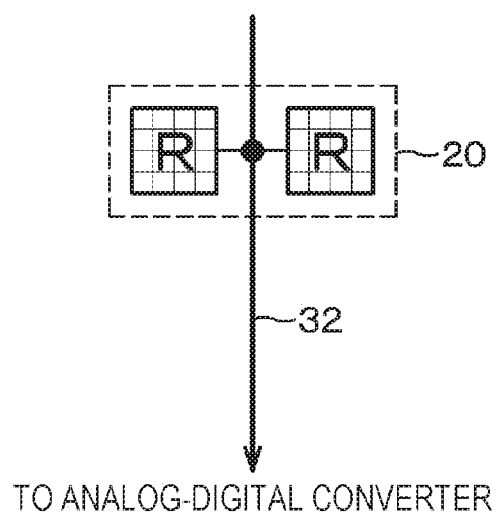
FIG. 13A is a view illustrating a pixel configuration of a pixel unit according to a second specific example of the example 3.
Figure 13B:
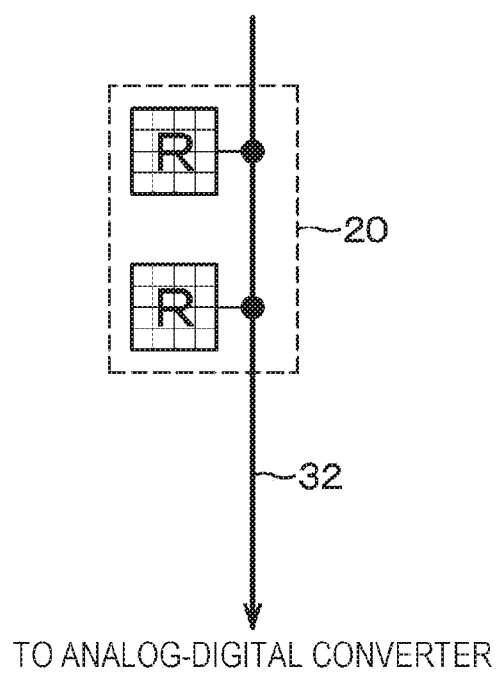
FIG. 13B is a view illustrating a pixel configuration of a pixel unit according to a third specific example of the example 3.

The pixel unit 20 according to the first specific example includes a total of 16 pixels of horizontal four pixels× vertical four pixels (pixels of four columns×four rows) of the same color adjacent to each other as illustrated in FIG. 12, and signals of the 16 pixels are added on a vertical signal line 32. The pixel unit 20 according to the second specific example includes two pixels of the same color adjacent to each other in the same pixel row as illustrated in FIG. 13A, and signals of the two pixels are added on the vertical signal line 32. The pixel unit 20 according to the third specific example includes two pixels of the same color adjacent to each other in the same pixel column as illustrated in FIG. 13B, and signals of the two pixels are added on the vertical signal line 32.

Note that, three examples of the first specific example, the second specific example, and the third specific example are herein given as another pixel configuration example of one pixel unit 20, but it is sufficient that the pixel unit 20 has a pixel configuration capable of realizing low-resolution readout by performing the pixel addition on the vertical signal line 32 before analog-digital conversion in addition to these three examples.

Example 4

An example 4 is a variation of the example 1 and is another example of high-resolution readout. In the example 1, in one pixel unit 20 including four pixels of horizontal two pixels×vertical two pixels, it is sequentially read out one pixel at a time at the time of high-resolution readout (refer to FIG. 4B). On the other hand, in the example 4, it is also possible to configure to read out two pixels together as illustrated in FIG. 14A or 14B.

Figure 14A:
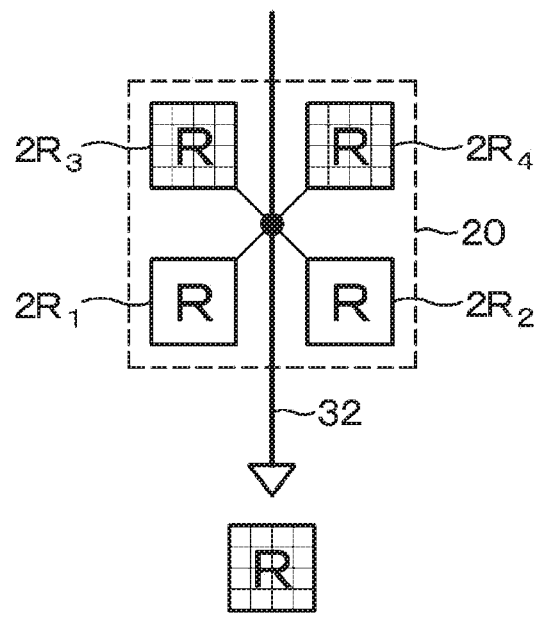
FIGS. 14A and 14B are views illustrating another example of high-resolution readout according to an example 4.
Figure 14B:
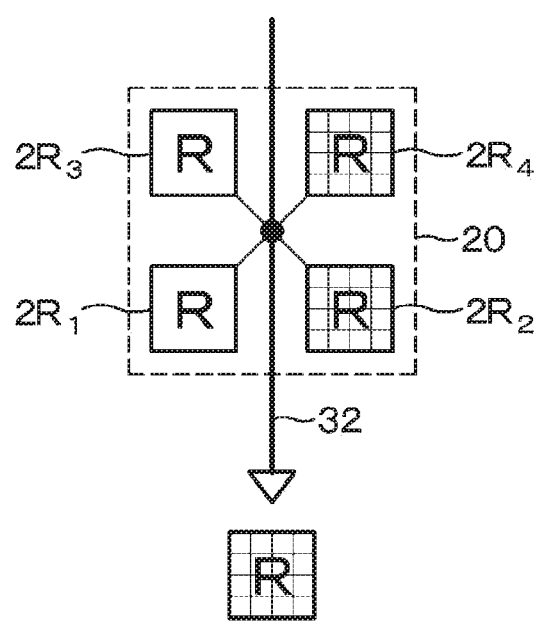

Note that, two types of combinations of the two pixels in FIGS. 14A and 14B are herein illustrated, but this is not limited to these combinations, and another combination of two pixels may be used, and the combination is not limited to the combination of two pixels but may be a combination of three pixels.

Example 5

An example 5 is an example in which a pixel unit 20 includes pixels of the same color separated from each other with a pixel of another color interposed therebetween. FIG. 15 illustrates a configuration of a substantial part of an imaging device according to the example 5. A color array of pixels of an imaging device according to the example 5 is a color array of a general imaging device, specifically, a Bayer array of red R, green G, and blue B in units of pixels. That is, the color array of the pixels of the imaging device according to the example 5 is the color array in which the pixels of the same color are not adjacent to each other.

Figure 16:
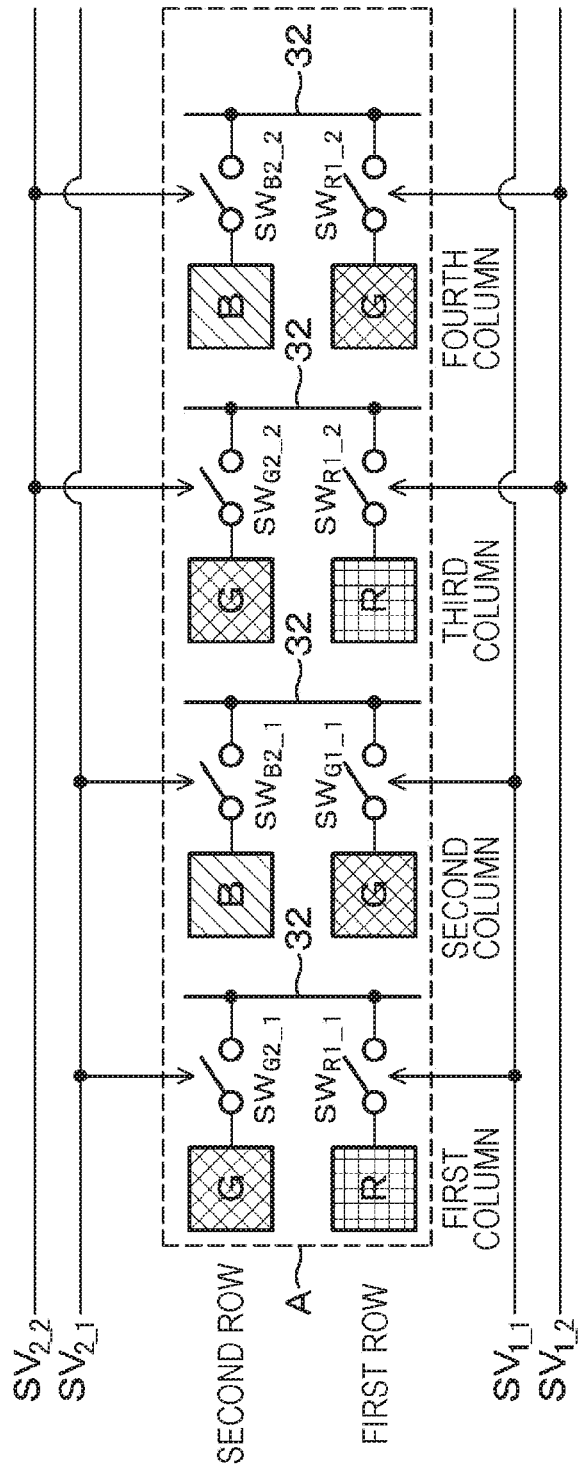
FIG. 16 is a circuit diagram illustrating a pixel switch for a total of eight pixels in first to fourth columns of first and second rows in FIG. 15.

In the example 5, pixel rows are selected by row selection signals $SV_{1\_1}/SV_{1\_2}$, $SV_{2\_1}/SV_{2\_2}$, $SV_{3\_1}/SV_{3\_2}$, . . . . The row selection signals $SV_{1\_1}/SV_{1\_2}$, $SV_{2\_1}/SV_{2\_2}$, $SV_{3\_1}/SV_{3\_2}$, . . . drive pixel switches provided for each pixel to select a pixel row and a pixel. FIG. 16 illustrates pixel switches for a total of eight pixels in first to fourth columns in first and second rows surrounded by a dashed square A in FIG. 15.

In the first row, a pixel switch $SW_{R1\_1}$ and a pixel switch $SW_{G1\_1}$ driven by the row selection signal $SV_{1\_1}$ are connected between an R pixel in the first column and a vertical signal line 32, and between a G pixel in the second column and the vertical signal line 32, respectively. Furthermore, a pixel switch $SW_{R1\_2}$ and a pixel switch $SW_{G1\_2}$ driven by the row selection signal $SV_{1\_2}$ are connected between an R pixel in the third column and the vertical signal line 32, and between a G pixel in the fourth column and the vertical signal line 32, respectively.

In the second row, a pixel switch $SW_{G2\_1}$ and a pixel switch $SW_{B2\_1}$ driven by the row selection signal $SV_{2\_1}$ are connected between a G pixel in the first column and the vertical signal line 32, and between a B pixel in the second column and the vertical signal line 32, respectively. Furthermore, a pixel switch $SW_{G2\_2}$ and a pixel switch $SW_{B2\_2}$ driven by the row selection signal $SV_{2\_2}$ are connected between a G pixel in the third column and the vertical signal line 32, and between a B pixel in the fourth column and the vertical signal line 32, respectively.

As illustrated in FIG. 15, four pixel columns adjacent to each other are made a unit, and one ends of the selection switch $SW_{1\_1}$, the selection switch $SW_{1\_2}$, the selection switch $SW_{2\_1}$, and the selection switch $SW_{2\_2}$ are connected to the vertical signal lines 32 of the respective pixel columns. Furthermore, the other ends of the selection switch $SW_{1\_1}$ in the first column and the selection switch $SW_{2\_1}$ in the third column are commonly connected, and the other ends of the selection switch $SW_{1\_2}$ in the second column and the selection switch $SW_{2\_2}$ in the fourth column are commonly connected. For fifth and subsequent columns, a similar configuration as that of the first to fourth columns is repeated in units of four pixel columns.

The selection switch $SW_{1\_1}$ and the selection switch $SW_{1\_2}$ are driven by a selection signal $SH_1$, and the selection switch $SW_{2\_1}$ and the selection switch $SW_{2\_2}$ are driven by a selection signal $SH_2$. The imaging device according to the example 5 has the color array in which the pixels of the same color are not adjacent to each other, so that the selection switch $SW_{1\_1}$, the selection switch $SW_{1\_2}$, the selection switch $SW_{2\_1}$, and the selection switch $SW_{2\_2}$ form a mechanism of adding the pixel signals of the two columns on a stage before an input of an analog-digital converter (ADC) 141.

One analog-digital converter 141 is arranged for every two pixel columns. Then, the other ends of the selection switches $SW_{1\_1}$ and $SW_{2\_1}$ commonly connected and the other ends of the selection switches $SW_{1\_2}$ and $SW_{2\_2}$ commonly connected are connected to the input end of the corresponding analog-digital converter 141.

Figure 17:
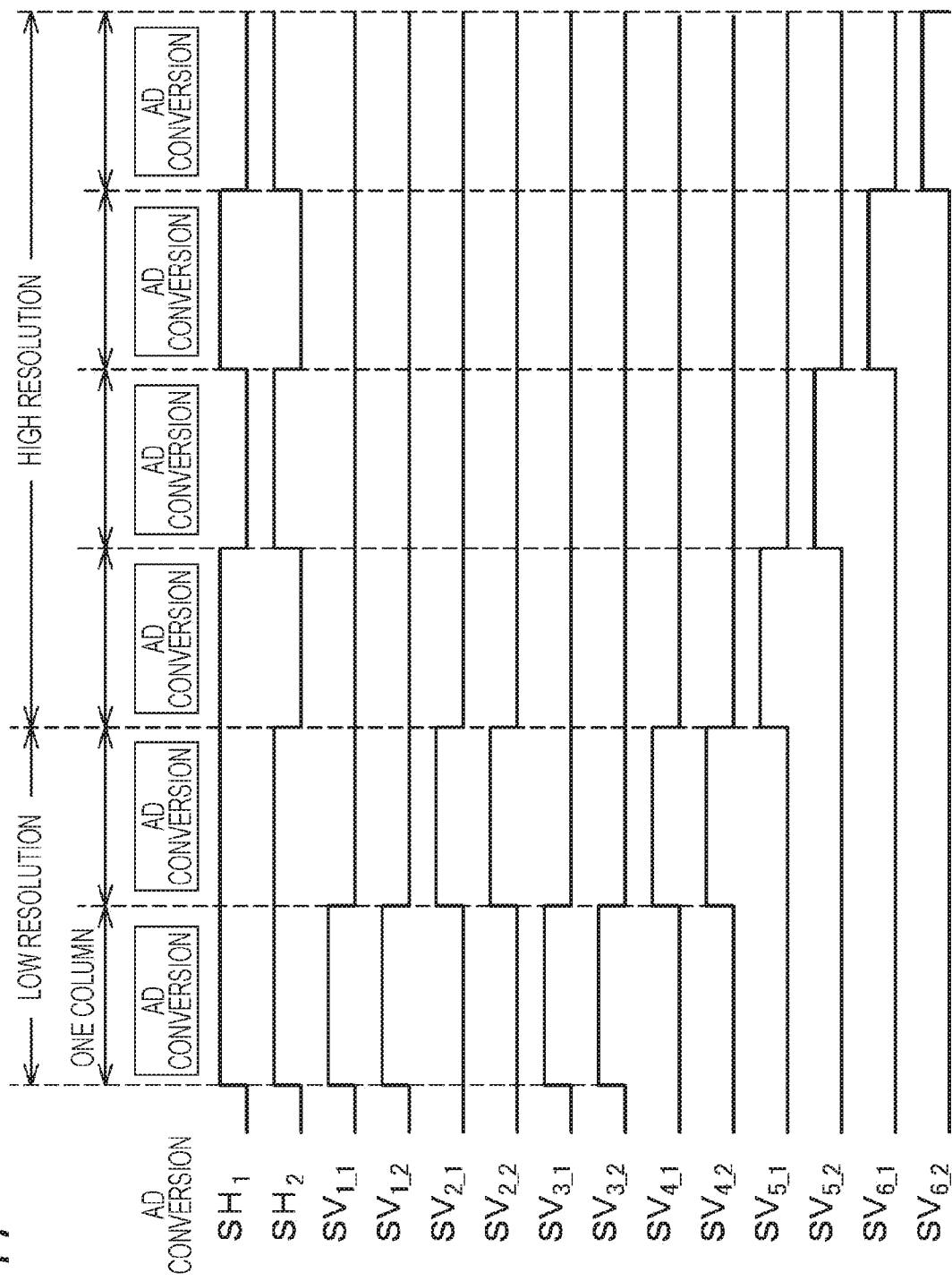
FIG. 17 is a timing waveform chart illustrating a timing relationship between selection signals $SH_1$ and $SH_2$ and row selection signals $SV_{1\_1}/SV_{1\_2}$, $SV_{2\_1}/SV_{2\_2}$, . . . , and $SV_{6\_1}/SV_{6\_2}$ in the imaging device according to the example 5.

FIG. 17 illustrates a timing relationship between the selection signals $SH_1$ and $SH_2$ and the row selection signals $SV_{1\_1}/SV_{1\_2}$, $SV_{2\_1}/SV_{2\_2}$, . . . , and $SV_{6\_1}/SV_{6\_2}$. Low-resolution readout and high-resolution readout may be realized by a combination of these signals.

Figure 18:
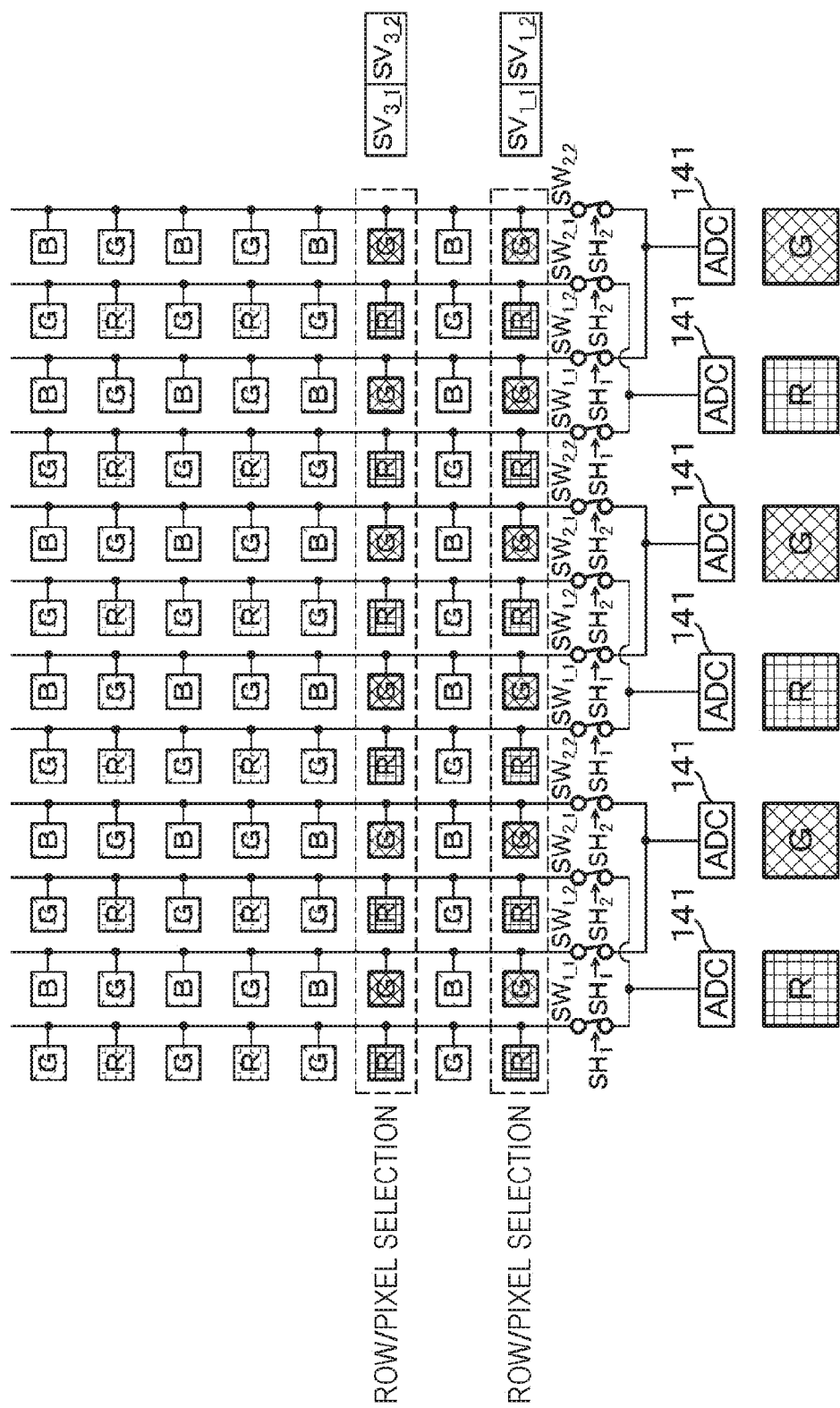
FIG. 18 is a view illustrating a state of low-resolution readout by the imaging device according to the example 5.

In the low-resolution readout, as illustrated in FIG. 18, for example, the first and third pixel rows are selected by the row selection signals $SV_{1\_1}/SV_{1\_2}$ and $SV_{3\_1}/SV_{3\_2}$. Then, in order to select and add the same color, the selection signals $SH_1$ and $SH_2$ turn on the selection switches $SW_{1\_1}$, $SW_{1\_2}$, $SW_{2\_1}$, and $SW_{2\_2}$. Therefore, the signals of the four pixels of the same color are analog-added, so that they may be read out by one analog-digital conversion.

Figure 19:
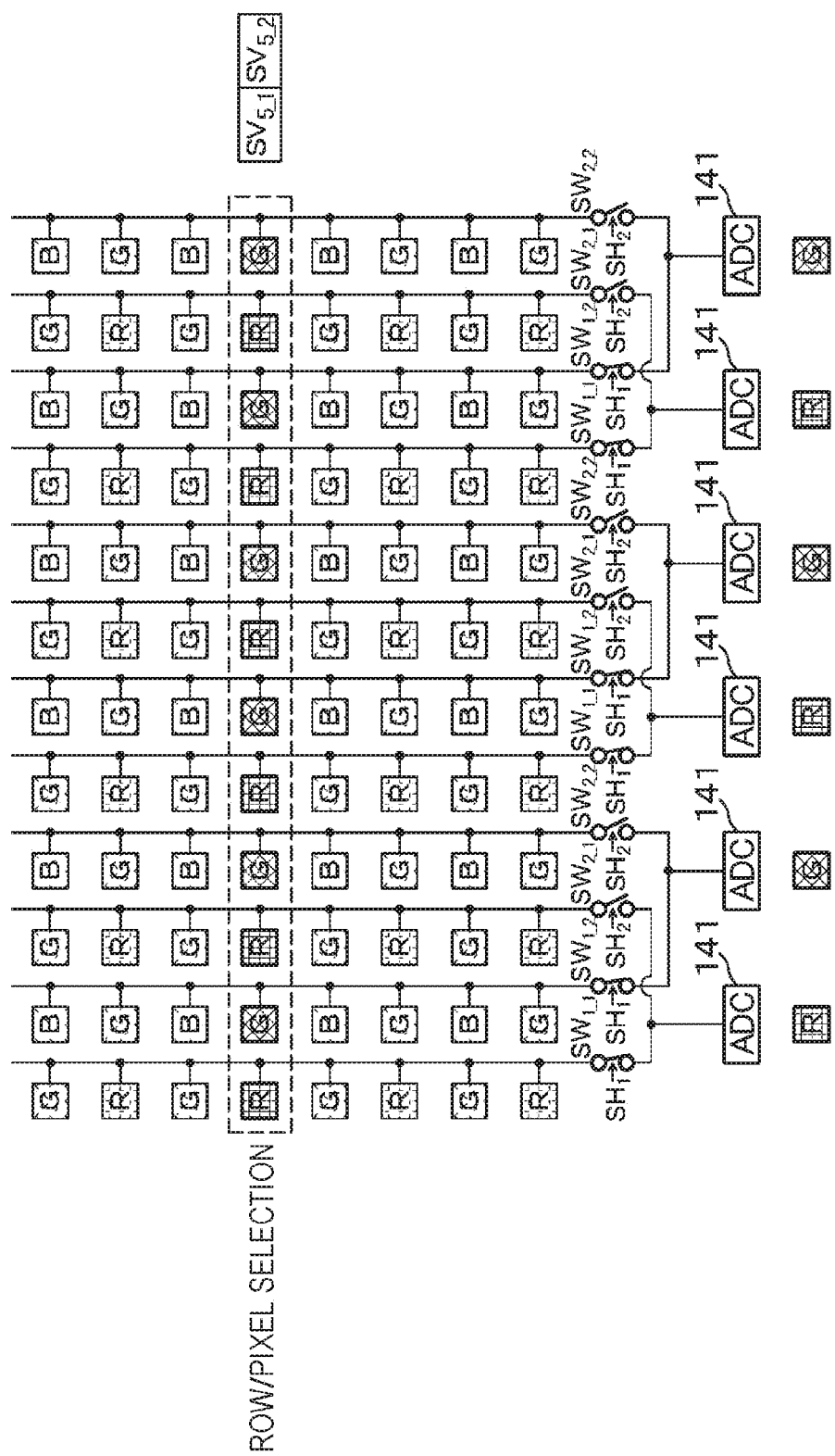
FIG. 19 is a view illustrating a state of high-resolution readout by the imaging device according to the example 5.

In the high-resolution readout, as illustrated in FIG. 19, for example, the signals are sequentially read out one pixel at a time such that a signal of one pixel is read out while putting only the row selection signal $SV_{5\_1}$ and the selection signal $SH_1$ into an active state, and then a signal of one pixel is read out while putting only the row selection signal $SV_{5\_2}$ and the selection signal $SH_2$ into an active state.

<Variation>

Although the technology of the present disclosure is described above on the basis of the preferred embodiment, the technology of the present disclosure is not limited to the embodiment. The configuration and structure of the imaging element described in the above embodiment are illustrative, and may be changed as appropriate.

For example, although a case of applying to the CMOS image sensor in which the pixels 2 are arranged in a matrix is described as an example in the above-described embodiment, the technology of the present disclosure is not limited to the application to the CMOS image sensor. That is, the technology of the present disclosure may be applied to all X-Y address imaging devices in which the pixels 2 are two-dimensionally arranged in a matrix.

<Application Example>

Figure 20:
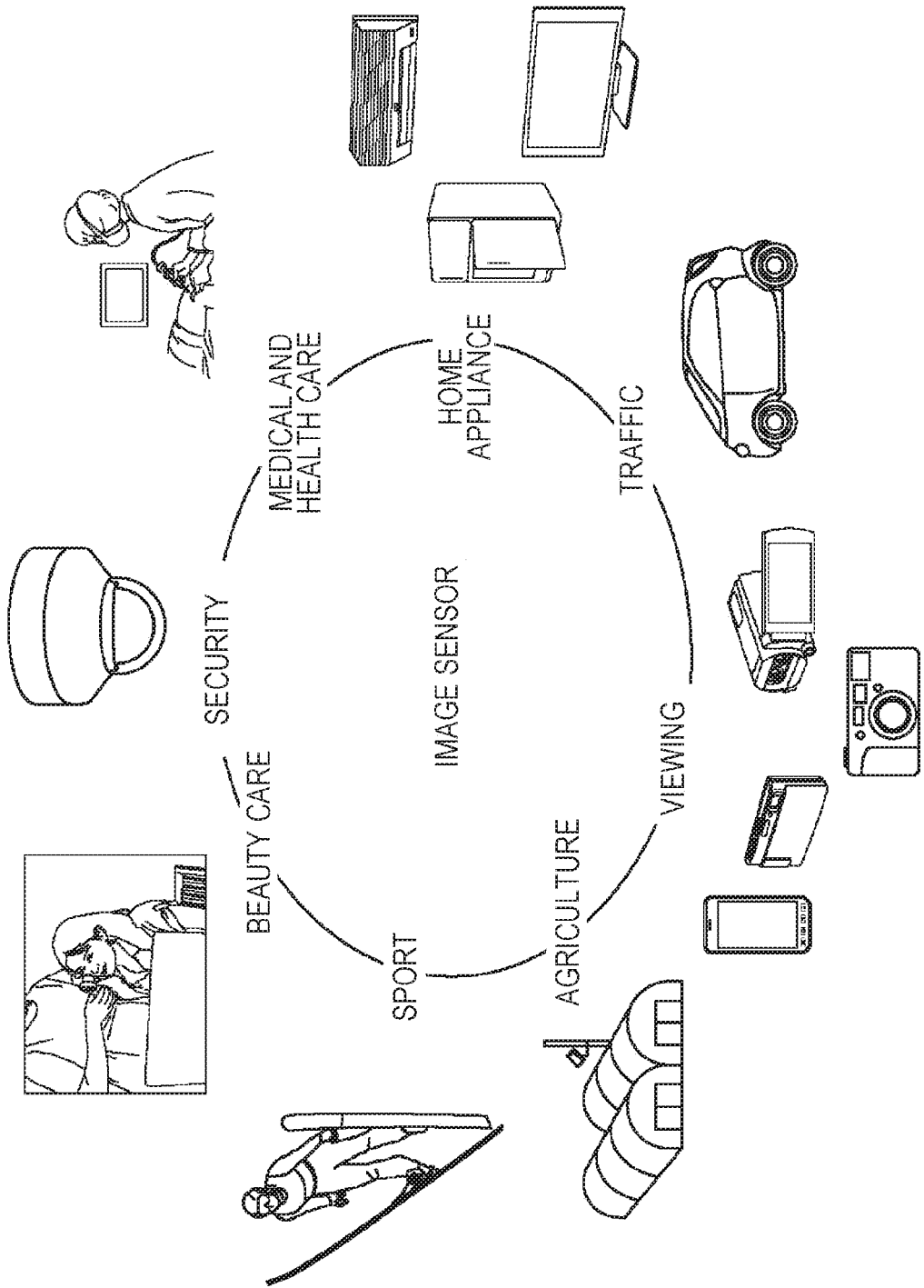
FIG. 20 is a view illustrating an application example of a technology according to the present disclosure.

The imaging device according to this embodiment described above may be used in various devices which sense light such as visible light, infrared light, ultraviolet light, and X-rays, as illustrated in FIG. 20, for example. Specific examples of the various devices are listed below.

A device which takes an image to be used for viewing such as a digital camera and a portable device with a camera function A device for traffic purpose such as an in-vehicle sensor which takes images of the front, rear, surroundings, interior and the like of an automobile, a surveillance camera for monitoring traveling vehicles and roads, and a ranging sensor which measures a distance between vehicles and the like for safe driving such as automatic stop, recognition of a driver's condition and the like A device for home appliance such as a television, a refrigerator, and an air conditioner which images a user's gesture and performs device operation according to the gesture A device for medical and health care use such as an endoscope and a device which performs angiography by receiving infrared light A device for security use such as a security monitoring camera and an individual certification camera A device for beauty care such as a skin condition measuring device which takes an image of skin and a microscope which takes an image of scalp A device for sporting use such as an action camera and a wearable camera for sporting use and the like A device for agricultural use such as a camera for monitoring land and crop states <Application Example>

The technology according to the present disclosure is applicable to various products. More specifically, the invention may be applied to an imaging system such as a digital still camera or a video camera, a mobile terminal device having an imaging function such as a mobile phone, or an electronic device such as a copying machine using an imaging element in an image read unit. Hereinafter, a case where the invention is applied to an imaging system such as a digital still camera or a video camera is described.

[Imaging System]

Figure 21:
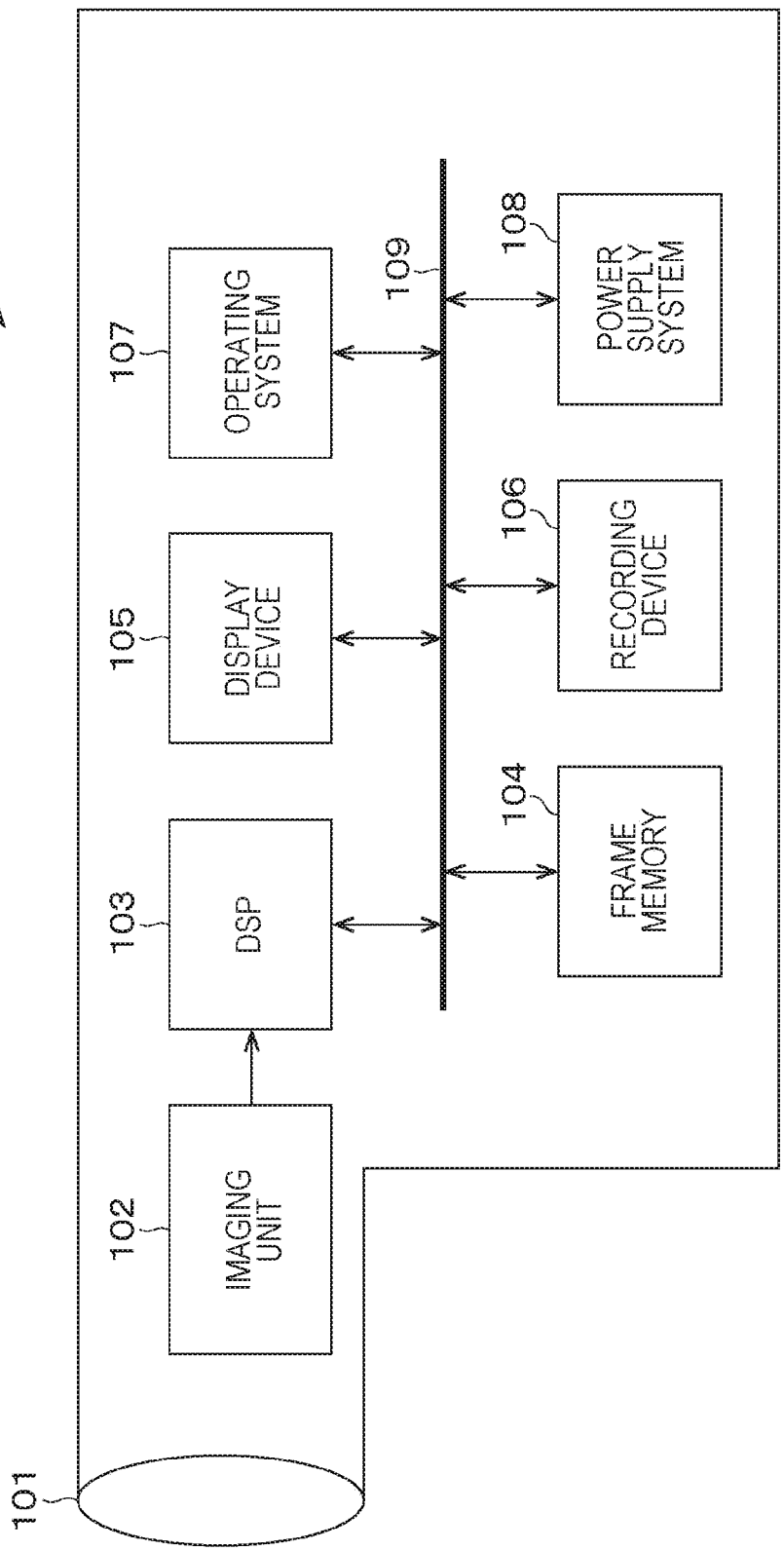
FIG. 21 is a block diagram schematically illustrating a configuration of an imaging system which is an example of an electronic device.

FIG. 21 is a block diagram illustrating a configuration of an imaging system which is an example of an electronic device. As illustrated in FIG. 21, an imaging system 100 according to this example includes an imaging optical system 101 including a lens group and the like, an imaging unit 102, a digital signal processor (DSP) circuit 103, a frame memory 104, a display device 105, a recording device 106, an operating system 107, a power supply system 108 and the like. Then, the DSP circuit 103, the frame memory 104, the display device 105, the recording device 106, the operating system 107, and the power supply system 108 are connected to each other via a bus line 109.

The imaging optical system 101 captures incident light (image light) from a subject to form an image on an imaging surface of the imaging unit 102. The imaging unit 102 converts a light amount of the incident light the image of which is formed on the imaging surface thereof by the optical system 101 to an electric signal in a pixel unit to output as a pixel signal. The DSP circuit 103 performs general camera signal processing such as white balance processing, demosaic processing, and gamma correction processing, for example.

The frame memory 104 is used to appropriately store data in the process of the signal processing in the DSP circuit 103. The display device 105 including a panel display device such as a liquid crystal display device and an organic electro luminescence (EL) display device displays a moving image or a still image taken by the imaging unit 102. The recording device 106 records the moving image or the still image taken by the imaging unit 102 on a recording medium such as a portable semiconductor memory, an optical disc, or a hard disk drive (HDD).

The operating system 107 issues an operation command regarding various functions of the imaging device 100 under an operation by a user. The power supply system 108 appropriately supplies various power supplies serving as operation power supplies of the DSP circuit 103, the frame memory 104, the display device 105, the recording device 106, and the operating system 107 to supply targets.

In the imaging system 100 having the above-described configuration, the imaging device according to the above-described embodiment may be used as the imaging unit 102. Therefore, image plane phase difference autofocus (AF) for automatically focusing the imaging optical system 101 may be realized. Furthermore, the imaging device according to the above-described embodiment may reduce a phenomenon that a color tone of a screen appears to change during a binning process while suppressing occurrence of failure or false color. Therefore, by using the imaging device as the imaging unit 102, it is possible to improve an image quality of the taken image especially during the binning process.

<Configuration that Present Disclosure May Take>

Note that, the present disclosure may also have the following configuration.

<<A. Imaging Device>>

[A-1] An imaging device including:
a detection unit that detects a specific region in a taken image as a region of interest;
a control unit that performs control to read out a pixel signal at first pixel resolution in a region including the region of interest and read out a pixel signal at second pixel resolution lower than the first pixel resolution in a region not including the region of interest; and
an analog-digital conversion unit that converts the pixel signal read out by the control by the control unit into a digital signal.

[A-2] The imaging device according to [A-1] described above,
in which the detection unit detects a region with motion in the taken image as the region of interest.

[A-3] The imaging device according to [A-2] described above,
in which the detection unit detects the region with motion in the taken image on the basis of a comparison result between image information of a current imaging frame and image information of at least one imaging frame before.

[A-4] The imaging device according to [A-3] described above,
in which the detection unit includes an image memory, a comparison unit, a motion amount memory, and a region of interest determination unit,
the image memory holds the image information of at least one imaging frame before,
the comparison unit obtains a difference absolute value between the image information of the current imaging frame and the image information held in the image memory,
the motion amount memory stores the difference absolute value obtained by the comparison unit as a motion amount from a past image to a current image, and
the region of interest determination unit determines the region of interest on the basis of the motion amount stored in the motion amount memory.

[A-5] The imaging device according to [A-3] or [A-4] described above,
in which the detection unit detects the region with motion in the taken image by using image information at the second pixel resolution.

[A-6] The imaging device according to any one of [A-1] to [A-5] described above,
in which, when a plurality of pixels in a pixel array unit is made a pixel unit,
the control unit selectively sets a first operation mode to add signals of a plurality of pixels in the pixel unit to supply to the analog-digital conversion unit and a second operation mode to independently supply the signals of the plurality of pixels to the analog-digital conversion unit.

[A-7] The imaging device according to [A-6] described above,
in which the control unit sets the first operation mode for the region of interest and sets the second operation mode for a region other than the region of interest.

[A-8] The imaging device according to [A-6] or [A-7] described above,
in which the plurality of pixels in the pixel unit shares one vertical signal line between the pixels and includes a control switch that selectively connects the pixels to the vertical signal line, and
the control unit selectively sets the first operation mode and the second operation mode by on/off controlling each control switch of the plurality of pixels.

[A-9] The imaging device according to any one of [A-6] to [A-8] described above,
in which the plurality of pixels in the pixel unit includes pixels of the same color adjacent to each other.

[A-10] The imaging device according to any one of [A-6] to [A-8] described above,
in which the plurality of pixels in the pixel unit includes pixels of the same color separated from each other with a pixel of another color interposed.

<<B. Driving Method of Imaging Device>>

[B-1] A driving method of an imaging device when driving an imaging device including an analog-digital conversion unit that converts a pixel signal into a digital signal, the driving method including:
detecting a specific region in a taken image as a region of interest; and
reading out a pixel signal at first pixel resolution in a region including the region of interest and reading out a pixel signal at second pixel resolution lower than the first pixel resolution in a region not including the region of interest.

[B-2] The driving method of an imaging device according to [B-1] described above, the driving method including:
detecting a region with motion in the taken image as the region of interest.

[B-3] The driving method of an imaging device according to [B-2] described above, the driving method including:
detecting the region with motion in the taken image on the basis of a comparison result between image information of a current imaging frame and image information of at least one imaging frame before.

[B-4] The driving method of an imaging device according to [B-3] described above, the driving method including:

detecting the region with motion in the taken image by using image information at the second pixel resolution.

[B-5] The driving method of an imaging device according to any one of [B-1] to [B-4] described above, the driving method including:

when a plurality of pixels in a pixel array unit is made a pixel unit, selectively setting a first operation mode to add signals of a plurality of pixels in the pixel unit to supply to the analog-digital conversion unit and a second operation mode to independently supply the signals of the plurality of pixels to the analog-digital conversion unit.

[B-6] The driving method of an imaging device according to [B-5] described above, the driving method including:

setting the first operation mode for the region of interest and setting the second operation mode for a region other than the region of interest.

[B-7] The driving method of an imaging device according to [B-6] described above, in which the plurality of pixels in the pixel unit shares one vertical signal line between the pixels and includes a control switch that selectively connects the pixels to the vertical signal line, and the first operation mode and the second operation mode are selectively set by on/off control of each control switch of the plurality of pixels.

[B-8] The driving method of an imaging device according to [B-5] or [B-6] described above, in which the plurality of pixels in the pixel unit includes pixels of the same color adjacent to each other.

[B-9] The driving method of an imaging device according to [B-5] or [B-6] described above, in which the plurality of pixels in the pixel unit includes pixels of the same color separated from each other with a pixel of another color interposed.

REFERENCE SIGNS LIST

1 Imaging device
2 Pixel
11 Pixel array unit
12 Row selection unit
13 Constant current source unit
14 Analog-digital conversion unit
15 Horizontal transfer scan unit
16 Image processing unit
17 Output I/F unit
18 Region of interest detection unit
19 Control unit
20 Pixel unit
21 Photodiode
22 Transfer transistor
23 Reset transistor
24 Amplification transistor
25 Selection transistor
31 ($31_1$ to $31_m$) Pixel drive line
32 ($32_1$ to $32_n$) Vertical signal line
141 Analog-digital converter

The invention claimed is:

1. An imaging device, comprising:
   a detection unit configured to detect, as a region of interest, a specific region with motion in a taken image by comparison of image information of a current imaging frame and image information of at least one imaging frame, wherein
   the at least one imaging frame is prior to the current imaging frame, and
   a resolution of the at least one imaging frame is higher than a resolution of the current imaging frame;
   a control unit configured to:
   control read out of a first pixel signal at a first pixel resolution in a first region including the region of interest; and
   control read out of a second pixel signal at a second pixel resolution lower than the first pixel resolution in a second region excluding the region of interest; and
   an analog-digital conversion unit configured to convert the first pixel signal into a first digital signal and the second pixel signal into a second digital signal.

2. The imaging device according to claim 1, wherein
   the detection unit includes an image memory, a comparison unit, a motion amount memory, and a region of interest determination unit,
   the image memory is configured to hold the image information of the at least one imaging frame,
   the comparison unit is configured to obtain a difference absolute value between the image information of the current imaging frame and the image information of the at least one imaging frame held in the image memory,
   the motion amount memory is configured to store the difference absolute value obtained by the comparison unit as a motion amount from the at least one imaging frame to the current imaging frame, and
   the region of interest determination unit configured to determine the region of interest based on the motion amount stored in the motion amount memory.

3. The imaging device according to claim 1, further comprising a pixel array unit including a plurality of pixels, wherein
   the plurality of pixels constitutes a pixel unit, and
   the control unit is further configured to selectively set a first operation mode to add pixel signals of the plurality of pixels in the pixel unit to supply to the analog-digital conversion unit and a second operation mode to independently supply the pixel signals of the plurality of pixels to the analog-digital conversion unit.

4. The imaging device according to claim 3, wherein the control unit is further configured to:
   set the first operation mode for the region of interest; and
   set the second operation mode for the second region excluding the region of interest.

5. The imaging device according to claim 3, wherein
   the plurality of pixels in the pixel unit shares a vertical signal line between the plurality of pixels,
   each of the plurality of pixels includes a control switch configured to selectively connect a corresponding pixel of the plurality of pixels to the vertical signal line, and
   the control unit is further configured to selectively set the first operation mode and the second operation mode by on/off control of the control switch of each of the plurality of pixels.

6. The imaging device according to claim 3, wherein
   the plurality of pixels in the pixel unit includes a first pixel and a second pixel adjacent to the first pixel, and
   a color of the first pixel is same as a color of the second pixel.

7. The imaging device according to claim 3, wherein
   the plurality of pixels in the pixel unit includes a first pixel, a second pixel, and a third pixel,
   a color of the first pixel is same as a color the second pixel,
   the third pixel is between the first pixel and the second pixel, and a color of the third pixel is different from the color of the first pixel.

8. A driving method of an imaging device, the driving method comprising:
- detecting, as a region of interest, a specific region with motion in a taken image by comparing image information of a current imaging frame and image information of at least one imaging frame, wherein
  - the at least one imaging frame is prior to the current imaging frame, and
  - a resolution of the at least one imaging frame is higher than a resolution of the current imaging frame;
- reading out a first pixel signal at a first pixel resolution in a first region including the region of interest;
- reading out a second pixel signal at a second pixel resolution lower than the first pixel resolution in a second region excluding the region of interest; and
- converting, by an analog-digital conversion unit of the imaging device, the first pixel signal into a first digital signal and the second pixel signal into a second digital signal.

* * * * *